(12) United States Patent
Tanaka et al.

(10) Patent No.: US 7,295,056 B2
(45) Date of Patent: Nov. 13, 2007

(54) LEVEL SHIFT CIRCUIT

(75) Inventors: Keiji Tanaka, Takatsuki (JP); Osamu Sarai, Takatsuki (JP); Fuminori Tanemura, Takatsuki (JP); Yoshito Date, Otsu (JP); Jun Suzuki, Takatsuki (JP)

(73) Assignee: Matsushita Electric Industrial Co., Ltd, Osaka (JP)

( * ) Notice: Subject to any disclaimer, the term of this patent is extended or adjusted under 35 U.S.C. 154(b) by 266 days.

(21) Appl. No.: 10/995,554

(22) Filed: Nov. 24, 2004

(65) Prior Publication Data

US 2006/0006919 A1    Jan. 12, 2006

(30) Foreign Application Priority Data

Nov. 28, 2003  (JP)  ............................. 2003-398291
Sep. 7, 2004   (JP)  ............................. 2004-259101

(51) Int. Cl.
  *H03L 5/00*  (2006.01)
(52) U.S. Cl. ......................................... 327/333; 326/81
(58) Field of Classification Search ................ 327/333; 326/80, 81
See application file for complete search history.

(56) References Cited

U.S. PATENT DOCUMENTS

| | | | |
|---|---|---|---|
| 5,705,946 A * | 1/1998 | Yin ............................. | 327/333 |
| 6,043,699 A | 3/2000 | Shimizu ...................... | 327/333 |
| 6,351,173 B1 * | 2/2002 | Ovens et al. ................ | 327/333 |
| 6,456,110 B1 | 9/2002 | Elamanchill et al. ......... | 326/68 |
| 2002/0011983 A1 * | 1/2002 | Yamazaki et al. ............ | 345/92 |
| 2003/0076149 A1 * | 4/2003 | Haga ........................... | 327/333 |
| 2003/0184358 A1 * | 10/2003 | Hanson et al. ............... | 327/333 |
| 2005/0195011 A1 * | 9/2005 | Tseng et al. ................ | 327/333 |

* cited by examiner

*Primary Examiner*—Kenneth B. Wells
*Assistant Examiner*—Ryan C. Jager
(74) *Attorney, Agent, or Firm*—Steptoe & Johnson LLP

(57) ABSTRACT

A level shift circuit having a latch function includes a precharging PMOS transistor MP1 which is turned on in a precharge period to interrupt a through current of an input stage, an NMOS transistor MN1 which inputs data and performs discharging in a data input period, and a transistor MP2 for holding data after level shifting. Thus, each of the transistors can have a minimum configuration. Since the level shift circuit has a latch function, it is possible to omit a circuit for latching input data, thereby reducing a circuit area.

23 Claims, 25 Drawing Sheets

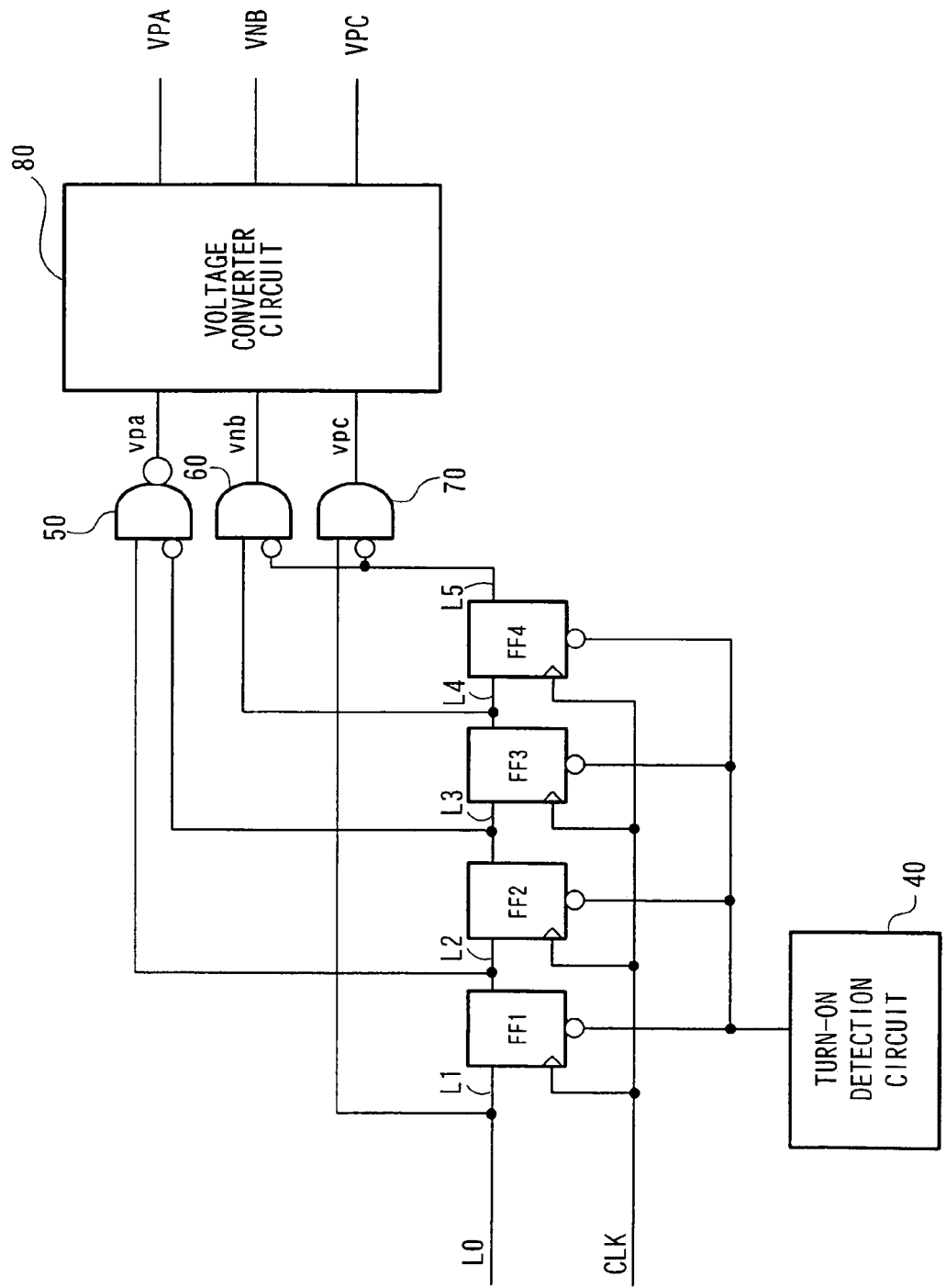
F I G. 3

US 7,295,056 B2

LEVEL SHIFT CIRCUIT

FIELD OF THE INVENTION

The present invention relates to a level shift circuit which is served as an interface between circuits receiving different power supply voltages.

BACKGROUND OF THE INVENTION

A conventional level shift circuit for converting a low-voltage signal into a high-voltage signal requires a circuit for latching input data in order to fix the input data, and an N-type MOS transistor requires a higher current capability than a P-type MOS transistor because the P-type MOS transistor and the N-type MOS transistor are simultaneously turned on during the switching of input data, so that the N-type MOS transistor has to be large in size. Thus, the level shift circuit has a large area and power consumption increases during the switching.

FIG. 25 shows an example of the conventional level shift circuit.

The level shift circuit is constituted of an inverter INV1 operating at a power supply voltage VDD1 of the circuit on the input side, Pch transistors P1 and P2 operating at a power supply voltage VDD2 of the circuit on the output side, Nch transistors N1 and N2, and two inverters INV2 and INV3.

Input signal Data is connected to the gate of the Nch transistor N1 and the input of the inverter INV1, and the output of the inverter INV1 is connected to the gate of the Nch transistor N2.

The source of the Nch transistor N1 is grounded to GND, the drain of the Nch transistor N1 is connected to the drain of the Pch transistor P1 and the gate of the Pch transistor P2, and the source of the Pch transistor P1 is connected to the power supply voltage VDD2.

The source of the Nch transistor N2 is grounded to GND, the drain of the Nch transistor N2 is connected to the drain of the Pch transistor P2, the gate of the Pch transistor P1, and the input of the inverter INV2. The source of the Pch transistor P2 is connected to the power supply voltage VDD2.

The output of the inverter INV2 is a signal OUT1 obtained by level-shifting input data. The signal OUT1 is connected to the input of the inverter INV3. The output of the inverter INV3 is an inverted signal OUT2 of the signal OUT1.

In this configuration, when the input signal Data is at H level, the transistor N1 is turned on, the voltage of a node V11 decreases, and the transistor P2 is turned on. Since the inverted signal of the input signal Data is connected to the gate of the transistor N2, the transistor N2 is turned off. A node V12 is thus set at H level. Therefore, the signal OUT1 is outputted at L level and the signal OUT2 is outputted at H level.

Conversely, when the input signal Data is at L level, the transistor N2 is turned on, the voltage of a node V12 decreases, and the transistor P1 is turned on. Since the input signal Data is at L level, the transistor N1 is turned off. Thus, the node V11 is set at H level. The signal OUT1 is outputted at H level and the signal OUT2 is outputted at L level.

However, when the input signal Data is at H level, the node V11 is at L level, the node V12 is at H level, the transistor N1 is turned on, the transistor N2 is turned off, the transistor P2 is turned on, and the transistor P1 is turned off. When the input signal Data is changed from H level to L level, the transistor N1 is turned off and the transistor N2 is turned on. Thus, the transistors N2 and P2 are turned on and a through current passes through the transistors N2 and P2. Since the voltage of the node V12 has to be reduced to L level, the transistor N2 has to be increased in size.

Also when the input signal Data is changed from L level to H level, a through current passes through the transistors N1 and P1 and the voltage of the node V11 has to be reduced to L level. Thus, the transistor N1 has to be increased in size.

For this reason, the configuration of the conventional level shift circuit has high power consumption and a large circuit size. See Japanese Patent Laid-Open No. 11-136120.

A liquid crystal display driver requires level shift circuits as many as a number obtained by multiplying the number of outputs by the number of bits. For example, when a liquid crystal display driver has 384 outputs of 8 bits, 3072 level shift circuits are used. In the use of such a number of level shift circuits, power consumption is increased by a through current in the level shift circuits. Each of the level shift circuits has a large device size, resulting in a large circuit area.

It is an object of the present invention to provide a level shift circuit which eliminates a through current in the level shift circuit of CMOS structure and has a smaller circuit area than the conventional art.

DISCLOSURE OF THE INVENTION

In order to solve the problem, a level shift circuit of the present invention is a level shift circuit for converting a data signal operating at a first voltage into signals operating at a second voltage higher than the first voltage, wherein a first Pch transistor, a first Nch transistor, and a second Nch transistor are connected in series between the second voltage and a GND level, the gate of a first inverter is connected to the drain of the first Pch transistor, the input of a second inverter is connected to the output of the first inverter, the source of a second Pch transistor is connected to the output of the second inverter, the drain of the second Pch transistor is connected to the input of the first inverter, control signals are supplied from a control circuit to the gate of the first Pch transistor, the gate of the second Nch transistor, and the gate of the second Pch transistor, the data signal operating at the first voltage is applied to the gate of the first Nch transistor, and the output signals operating at the second voltage are outputted from the output of the first inverter or the output of the second inverter.

A third Nch transistor may be provided instead of the second Pch transistor inserted between the gate of the first inverter and the output of the second inverter.

The third Nch transistor may be provided in parallel with the second Pch transistor inserted between the gate of the first inverter and the output of the second inverter.

A capacitance may be connected to the gate of the first inverter instead of the second Pch transistor inserted between the gate of the first inverter and the output of the second inverter.

Further, the following configuration is also applicable: the series portion between the first Nch transistor and the second Nch transistor is replaced with the second Nch transistor, the output of an AND logic of the first voltage is connected to the gate of the second Nch transistor, and the data signal operating at the first voltage and a control signal from the control circuit is supplied to the input of the AND logic.

The control circuit comprises flip-flop circuits operating at the first voltage in two or more stages, several logic cells which are fed with the outputs of the stages of the flip-flop circuits and output the control signals, and a circuit for converting the control signals having been outputted from the several logic cells into the second voltage.

The control circuit further comprises a turn-on detection circuit for resetting or setting the flip-flop circuits of the two or more stages at turn-on.

Some or all of the flip-flop circuits of the two or more stages may be delay devices.

Further, the node for connecting the drain of the first Pch transistor and the drain of the first Nch transistor has a longer wire length than the node for connecting the source of the first Nch transistor and the drain of the second Nch transistor, so that a parasitic capacitance increases and a malfunction caused by electric discharge is prevented.

According to the present invention, when a plurality of level converters are provided for the single control circuit, current consumption and a circuit size can be reduced for a level shift circuit which converts a signal operating at the first voltage and a first GND level into a signal operating at the first voltage and a second GND level lower than the first GND level. The input data of the plurality of level converters is simultaneously subjected to level conversion and outputted, so that the redundancy of control circuits is eliminated and an area can be further reduced.

According to the present invention, for example, even when an input signal is switched, a through current does not pass through the first Pch transistor, the first Nch transistor, and the second Nch transistor, and thus the transistors can be reduced in size. Further, the number of devices does not increase in the level shift unit of the present invention, achieving a smaller circuit size.

A level shift circuit for converting a data signal operating at a first voltage and a first GND level into signals operating at the first voltage and a second GND level lower than the first GND level, wherein a first Pch transistor, a second Pch transistor, and a first Nch transistor are connected in series between the first voltage and the second GND level, the gate of a first inverter is connected to the drain of the second Pch transistor, the gate of a second inverter is connected to the output of the first inverter, the drain of a second Nch transistor is connected to the output of the second inverter, the source of the second Nch transistor is connected to the gate of the first inverter, control signals are supplied from a control circuit to the gate of the first Pch transistor, the gate of the first Nch transistor, and the gate of the second Nch transistor, the data signal is applied to the gate of the second Pch transistor, and the output signals operating at the second GND level are outputted from the output of the first inverter or the output of the second inverter.

With this configuration, current consumption and a circuit size can be reduced for a level shift circuit which converts a signal operating at the first voltage and the first GND level into a signal operating at the second GND level lower than the first GND level.

The present invention makes it possible to provide a level shift circuit having a latch function that achieves low power consumption and a small circuit area.

BRIEF DESCRIPTION OF THE DRAWINGS

FIG. 3 is a structural diagram showing a control circuit of (Embodiment 1)

DESCRIPTION OF THE EMBODIMENTS

Referring to FIGS. 1 to 24, the following will describe embodiments of the present invention.

Embodiment 1

FIGS. 1 to 4 show (Embodiment 1) of the present invention.

Figure 1:
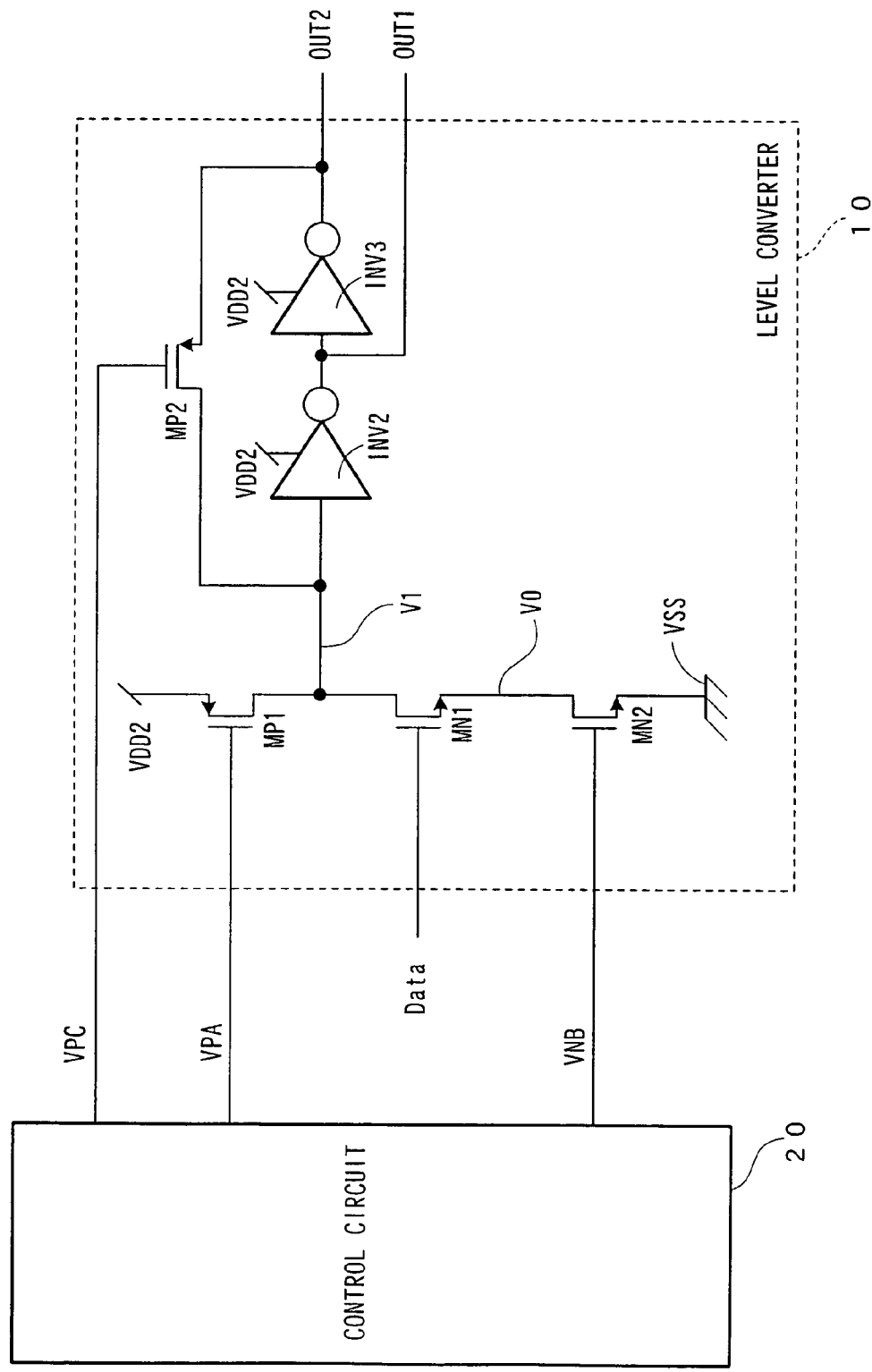
FIG. 1 is a structural diagram showing a level shift circuit according to (Embodiment 1) of the present invention.
Figure 2:
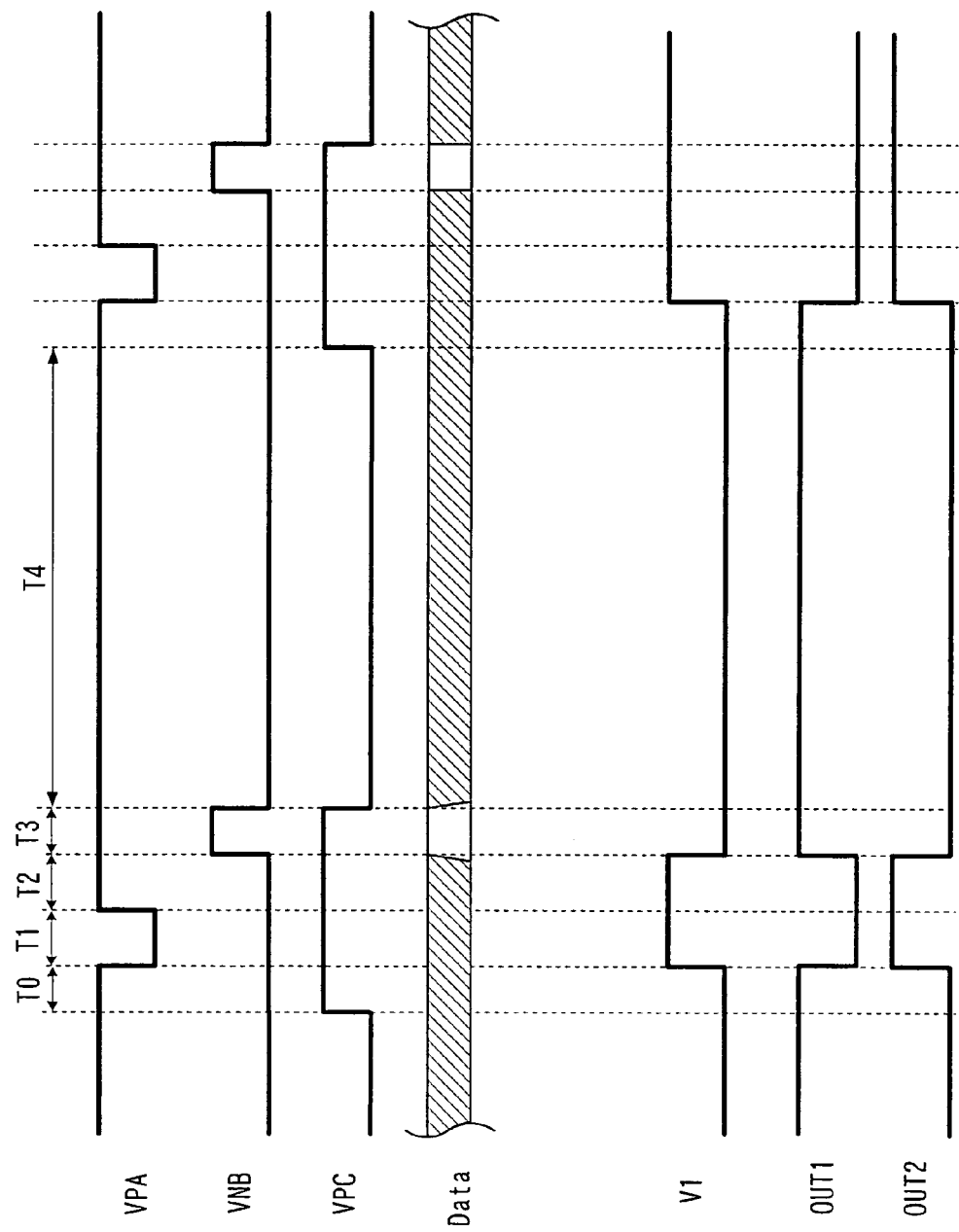
FIG. 2 is an operation explanatory drawing of (Embodiment 1)

FIGS. 1 and 2 show a level shift circuit according to (Embodiment 1) of the present invention.

In FIG. 1, the level shift circuit is constituted of a level converter 10 and a control circuit 20. The level converter 10 comprises two Pch transistors MP1 and MP2, two Nch transistors MN1 and MN2, and two inverters INV2 and INV3.

An input signal Data is a low-voltage input signal, signals OUT1 and OUT2 are output signals having been subjected to level conversion, reference numerals V0 and V1 denote internal nodes, and control signals VPA, VNB, and VPC are control signals having H level at a power supply voltage VDD2.

The control signals VPA, VNB, and VPC, which are outputted from the control circuit 20, are connected to the gates of the transistors MP1, MN2, and MP2, respectively. The input signal Data is inputted to the gate of the transistor MN1.

The source of the transistor MP1 is connected to the second power supply voltage VDD2, which is higher than that of a first power supply. The drain of the transistor MP1 is connected to the drain of the transistor MN1 and the node V1 is provided therebetween. The source of the transistor MN1 is connected to the drain of the transistor MN2 and the node V0 is provided therebetween. The source of the transistor MN2 is connected to VSS.

The gate of the first inverter INV2 is connected to the node V1. The output of the first inverter is connected to the gate of the second inverter INV3 and the node is outputted as the signal OUT1 having been subjected to level conversion. The output of the second inverter INV3 is outputted as the signal OUT2 having been subjected to level conversion.

The source and drain of the transistor MP2 are connected to the signal OUT2 and the node V1, respectively. Power is supplied to the first inverter INV2 and the second inverter INV3 from the power supply voltage VDD2.

FIG. 2 shows an operation example in which the transistor MP1 is turned on and the node V1 is precharged when the control signal VPA is at L level. After the control signal VPA is set at H level, the control signal VNB is set at H level and the input signal Data at that time is inputted. After the node V1 is stabilized, the control signal VPC is set at L level and output data is latched and held.

In the case where the level shift circuit of (Embodiment 1) is used for a liquid crystal display driver or a liquid crystal display source driver, the liquid crystal driver uses no data obtained during conversion and only uses data obtained when output is held, thereby causing no problem.

Referring to FIG. 2, the following will specifically describe an initial state in which the control signal VPA is at H level and the control signals VNB and VPC are at L level. Of the transistors MP1, MN2, and MP2, the transistor MP2 is turned on and the transistors MP1 and MN2 are turned off.

In period T0, the control signal VPC is set at H level and the transistor MP2 is turned off.

In period T1, the control signal VPA is set at L level, the transistor MP1 is turned on, and the node V1 is precharged to H level. The signal OUT1 makes a transition to L level and the signal OUT2 makes a transition to H level temporarily in a precharge period.

In period T2, the control signal VPA is set at H level and the transistor MP1 is turned off. In period T3, the control signal VNB is set at H level and the transistor MN2 is turned on. Further, the logic level of the input signal Data is changed in period T3. At this point, when H level is inputted to the input signal Data, the node V1 is at L level. When the input signal Data is at L level, the transistor MN1 is turned off and thus the node V1 holds H level.

In period T4, the transistor MN2 is turned off when the control signal VNB is set at L level, and the transistor MP2 is turned on when the control signal VPC is set at L level. Thus, a latch state is obtained and a logic level is held.

The level shift circuit captures the input signal Data of period T3 and outputs data captured in period T4 as the signals OUT1 and OUT2, so that the circuit acts as a level shift circuit having a latch function.

FIG. 3 shows the control circuit 20.

The control circuit 20 is constituted of flip-flop circuits FF1, FF2, FF3, and FF4, each of which receives a level shift conversion signal L0 and has a clock CLK, logic cells constituted of logic circuits 50, 60, and 70, and a voltage converter circuit 80.

Figure 4:
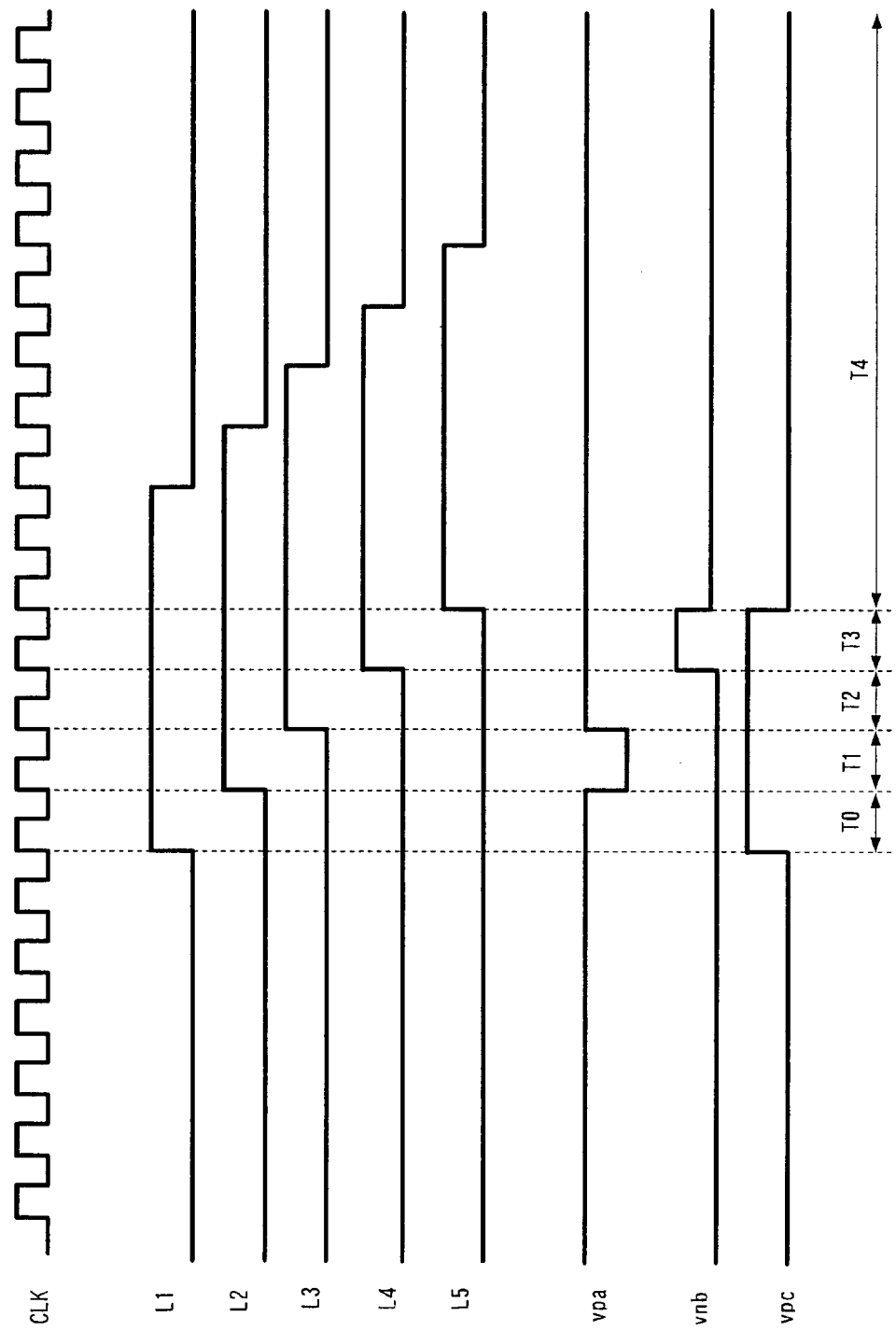
FIG. 4 is a timing chart of the control circuit of (Embodiment 1)

FIG. 4 is a timing chart showing the control circuit 20. Based on L1, L2, L3, and L4 obtained by shifting the level shift conversion signal L0 in the flip-flop circuits FF1, FF2, FF3, and FF4, signals vpa, vnb, and vpc are generated according to the following logic:

$vpa = \overline{(L2 \cdot \overline{L3})}$ ($\overline{L2}$ inverted from L2)

$vnb = L4 \cdot \overline{L5}$ $vpc = L1 \cdot \overline{L5}$

The voltage converter circuit 80 of FIG. 3 converts the signals vpa, vnb, and vpc into high-voltage control signals VPA, VNB, and VPC, respectively.

Moreover, a turn-on detection circuit 40 is provided to reset or set the flip-flop circuits FF1, FF2, FF3, and FF4, so that it is possible to prevent a short circuit or an open circuit on the node V1 of the level converter 10 in an indeterminate logic state at turn-on.

Further, the node for connecting the drain of the transistor MP1 and the drain of the transistor MN1 has a longer wire length than the node for connecting the source of the transistor MN1 and the drain of the transistor MN2, so that a parasitic capacitance increases and a malfunction caused by electric discharge is prevented.

To be specific, in the level shift circuit of (Embodiment 1) shown in FIG. 1, the following is obtained:
the input signal Data: (low voltage 3 volts/0 volts)
the signals OUT1 and OUT2: high voltage (13 volts/0 volts) after level shifting, and
the control signals VPA, VNB, and VPC of high voltage (13 volts/0 volts).

Proper timing control is performed on the control signals VPA, VNB, and VPC to prevent the transistors MP1, MN1, and MP2 from being turned on at the same time, thereby reducing the size of each device. The transistor MP2 has a latch function in the level shift circuit.

Embodiment 2

Figure 5:
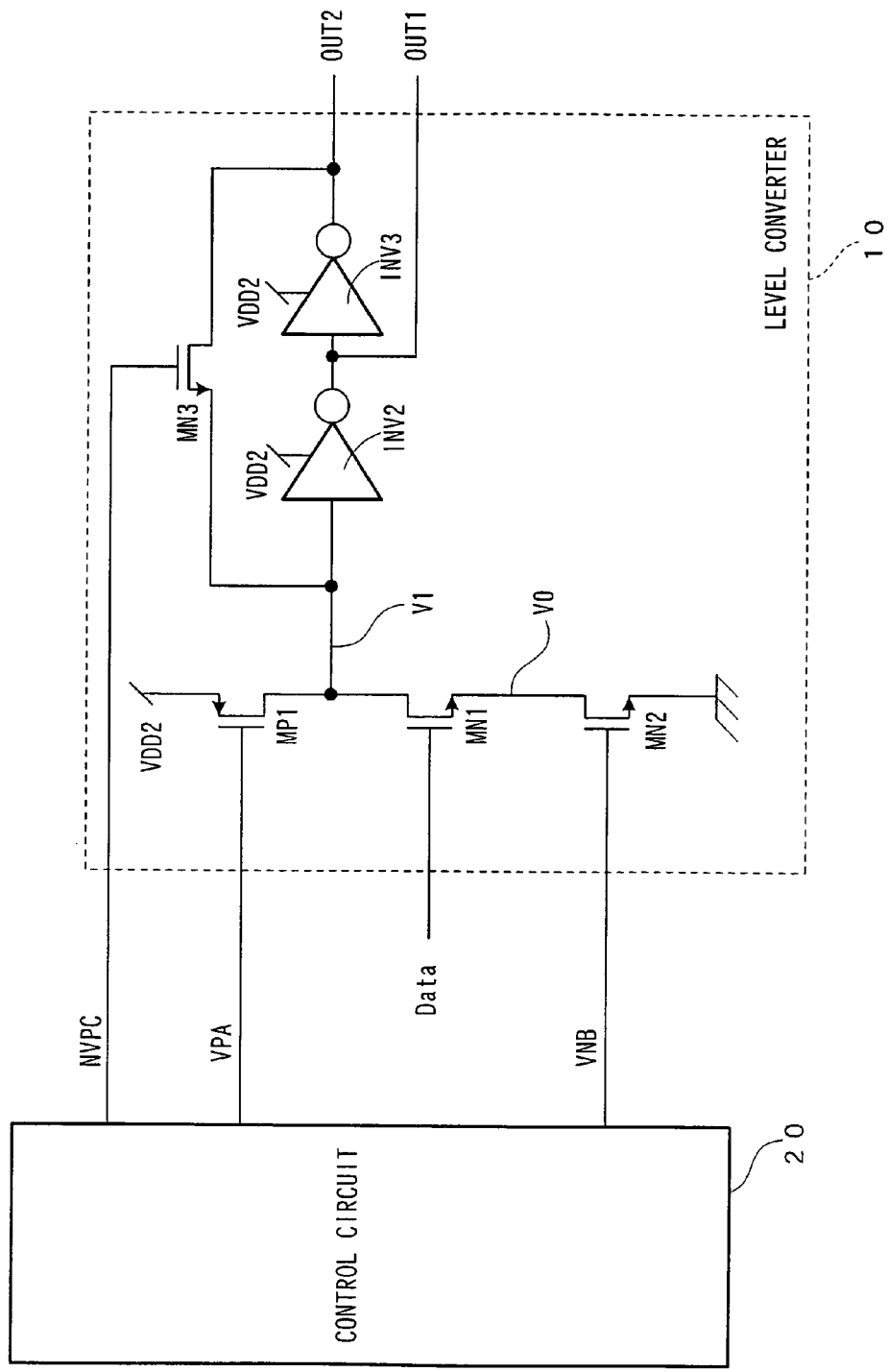
FIG. 5 is a structural diagram of a level shift circuit according to (Embodiment 2) of the present invention.

FIG. 5 shows a level shift circuit according to (Embodiment 2) of the present invention. An Nch transistor MN3 is used instead of the transistor MP2 of (Embodiment 1) shown in FIG. 1, and other configurations are similar to those of FIG. 1.

In FIG. 5, an inverted signal NVPC of a control signal VPC is connected from a control circuit 20 to the gate of the transistor MN3. Thus, the same operations as the circuit of FIG. 1 are obtained.

Embodiment 3

Figure 6:
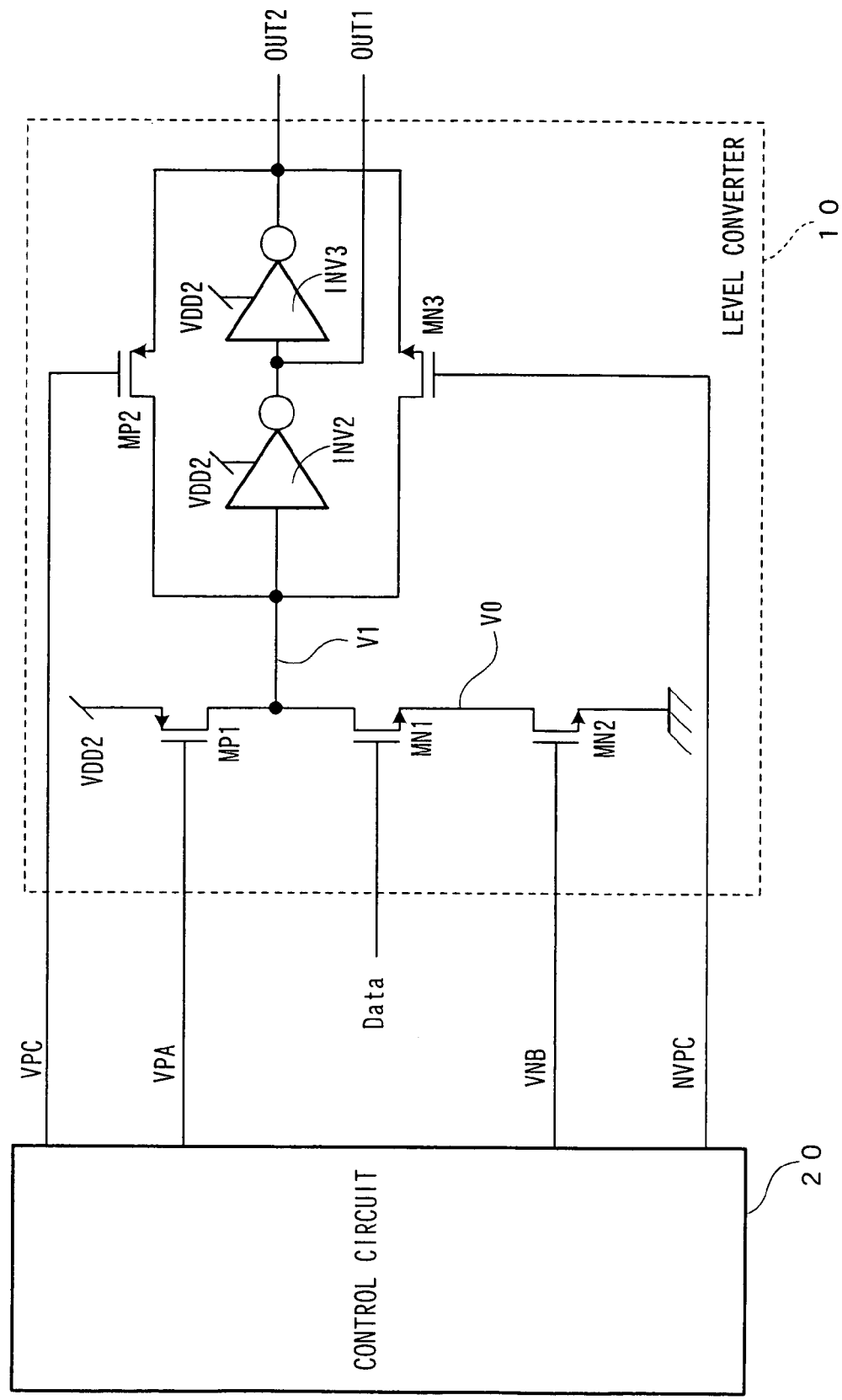
FIG. 6 is a structural diagram of a level shift circuit according to (Embodiment 3) of the present invention.

FIG. 6 shows a level shift circuit according to (Embodiment 3) of the present invention. An Nch transistor MN3 is inserted in parallel with the transistor MP2 of (Embodiment 1) shown in FIG. 1. Other configurations are similar to those of FIG. 1.

In FIG. 6, an inverted signal NVPC of a control signal VPC is connected from a control circuit 20 to the gate of the transistor MN3. Thus, the same operations as the circuit of FIG. 1 are obtained.

Embodiment 4

Figure 7:
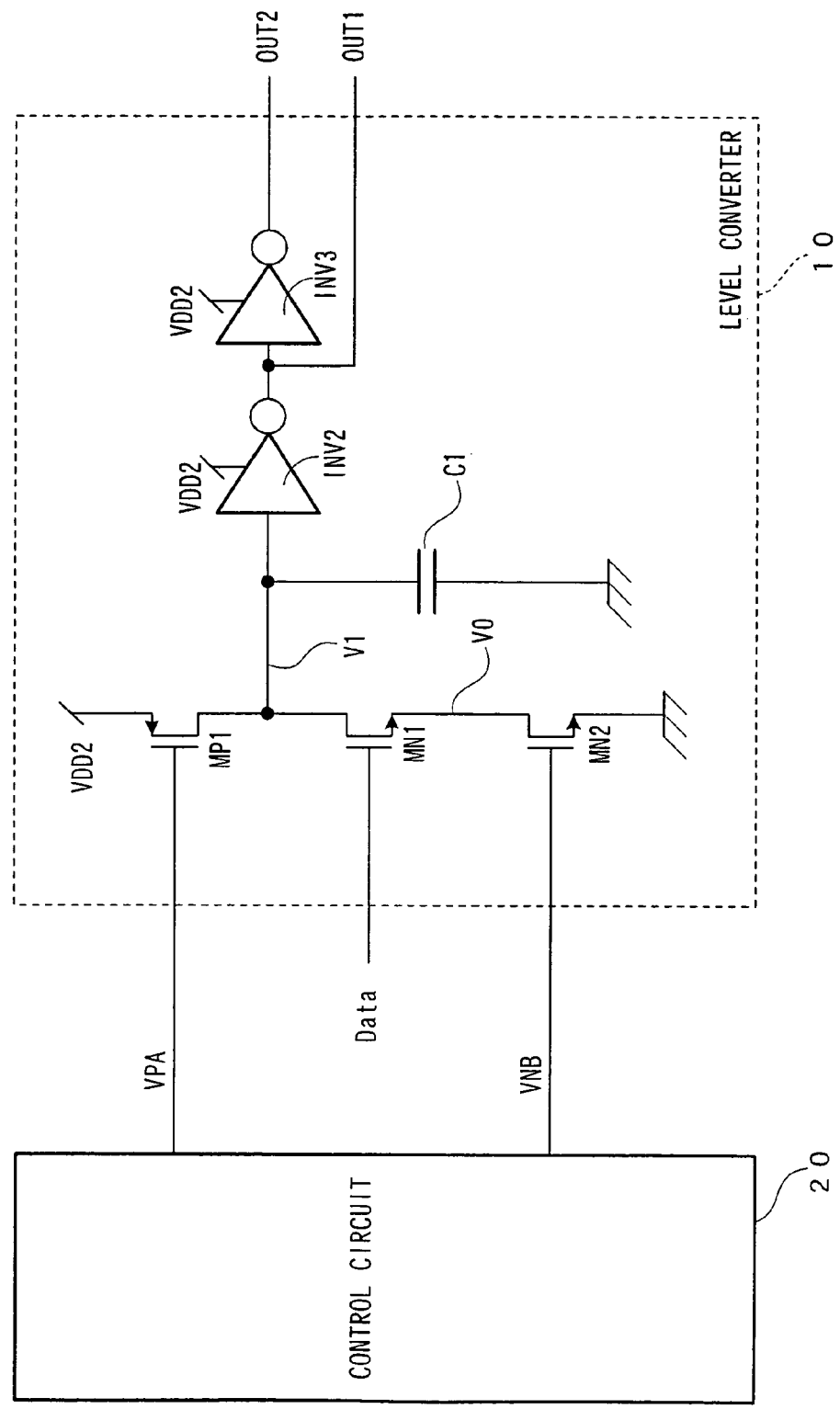
FIG. 7 is a structural diagram of a level shift circuit according to (Embodiment 4) of the present invention.

FIG. 7 shows a level shift circuit according to (Embodiment 4) of the present invention. Instead of the transistor MP2 for a latching operation in (Embodiment 1) of FIG. 1, a capacitance C1 is added to a node V1 to hold the potential of the node V1. Other configurations are similar to those of FIG. 1. Thus, the same operations as the circuit of FIG. 1 are obtained.

Embodiment 5

Figure 8:
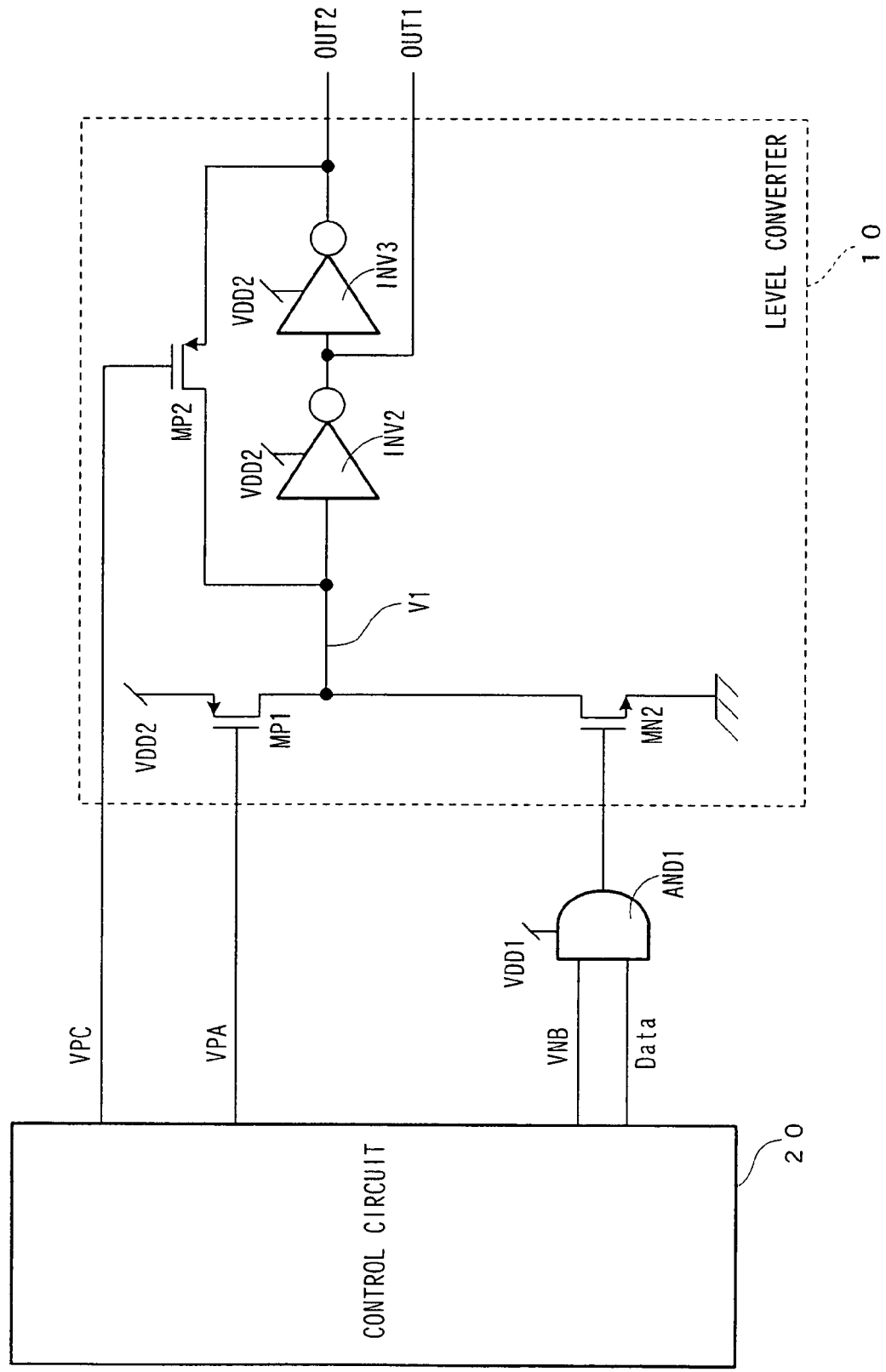
FIG. 8 is a structural diagram of a level shift circuit according to (Embodiment 5) of the present invention.

FIG. 8 shows a level shift circuit according to (Embodiment 5) of the present invention.

The level shift circuit is constituted of a level converter 10 and a control circuit 20. The transistors MN1 and MN2 of (Embodiment 1) shown in FIG. 1 are caused to act as a single Nch transistor MN2, and the output of an AND logic circuit AND1 whose input is fed with a control signal VNB and an input signal Data is connected to the gate of the transistor MN2. Other configurations are similar to those of FIG. 1. The AND logic circuit AND1 is driven by a first power supply voltage VDD1 which is lower than a second power supply voltage VDD2.

Thus, the same operations as the circuit of FIG. 1 are obtained. When a device for the transistor MN1 of the breakdown voltage of the second power supply voltage VDD2 is larger in size than a device for the AND logic circuit AND1 on the low voltage side, a circuit area can be reduced effectively.

Embodiment 6

Figure 9:
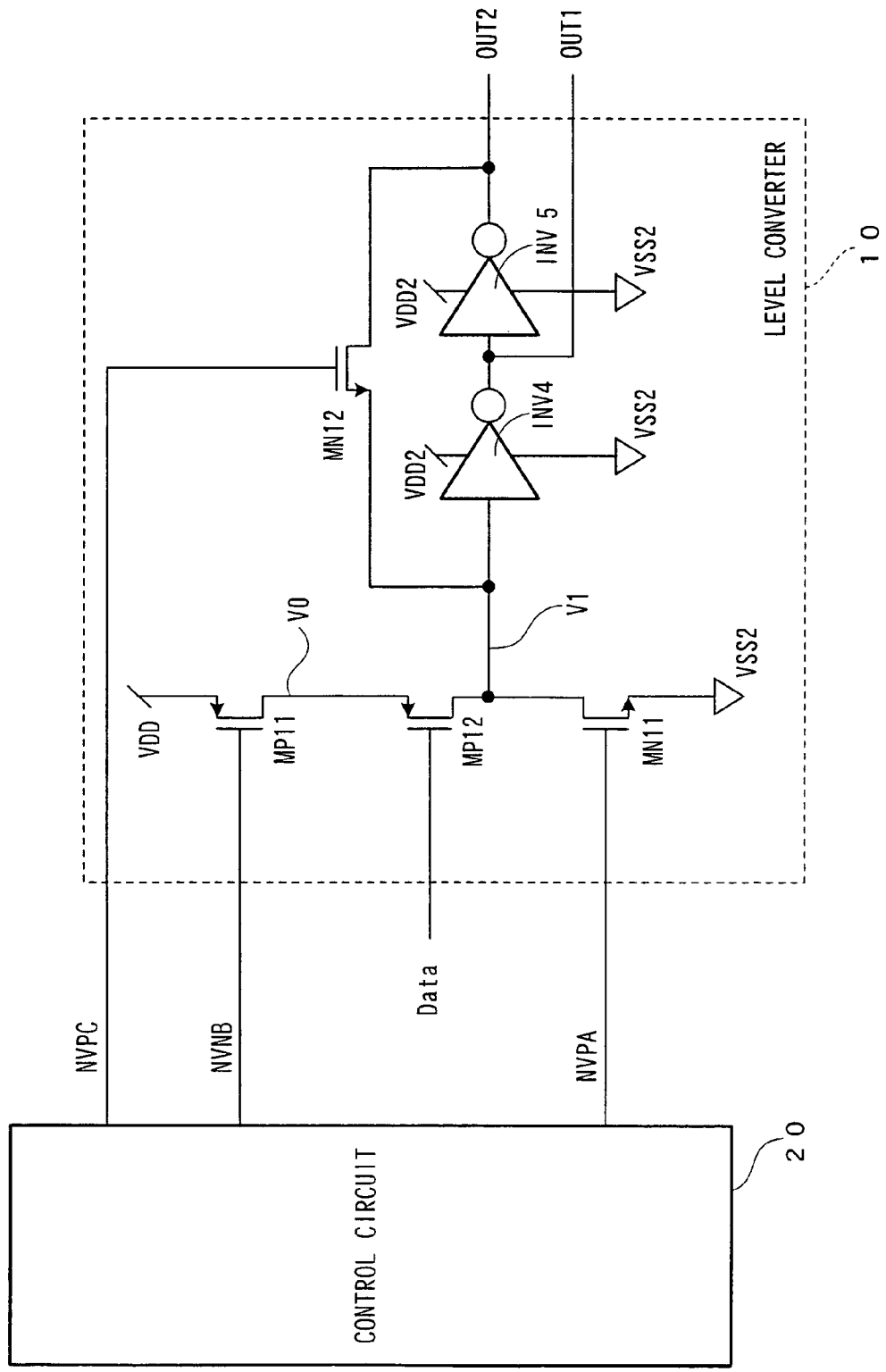
FIG. 9 is a structural diagram of a level shift circuit according to (Embodiment 6) of the present invention.

FIG. 9 shows a level shift circuit according to (Embodiment 6) of the present invention.

The level shift circuit has a power supply voltage VDD for common use and different GND levels. (Embodiment 6) is different from (Embodiment 1) of FIG. 1 in that VDD and GND and Pch and Nch transistors are turned upside down and control signals NVNB, NVPA, and NVPC are connected from a control circuit 20 to the gates of transistors MP11, MN11, and MN12, respectively. An input signal Data operating at a low voltage (first power supply voltage VDD1) and a first GND level is inputted to the gate of a transistor MP12. L level is converted to a second GND level and outputted as signals OUT1 and OUT2.

Figure 10:
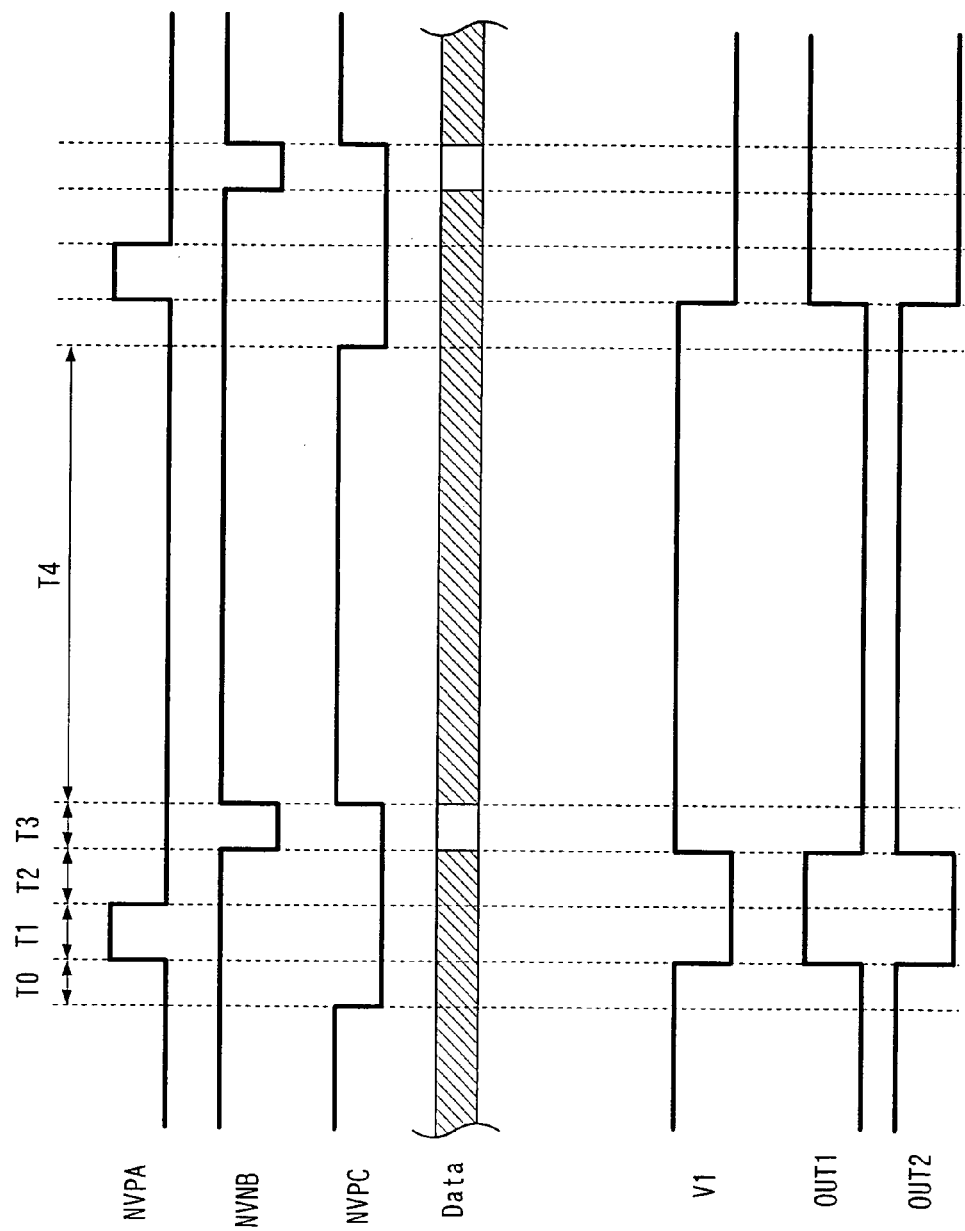
FIG. 10 is an operation explanatory drawing of (Embodiment 6)

FIG. 10 is an operation example of FIG. 9.

The transistor MN11 is turned on and a node V1 is discharged when the control signal NVPA is at H level. After the control signal NVPA is set at L level, the control signal NVNB is set at L level and the input signal Data at that time is inputted. After the node V1 is stabilized, the control signal NVPC is set at H level and output data is latched and held.

Referring to FIG. 10, the following will specifically describe an initial state in which the control signal NVPA is at L level, the control signal NVNB is at H level, and the control signal NVPC is at H level.

Of the transistors MP11, MN11, and MN12, the transistor MN12 is turned on and the transistors MP11 and MN11 are turned off. In period T0, the control signal NVPC is set at L level and the transistor MN12 is turned off.

In period T1, the control signal NVPA is set at H level, the transistor MN11 is turned on, and the node V1 is discharged to L level. The signal OUT1 makes a transition to H level and the signal OUT2 makes a transition to L level temporarily in a discharge period.

In period T2, the control signal NVPA is set at L level and the transistor MN11 is turned off. In period T3, the control signal NVNB is set at L level and the transistor MP11 is turned on. Further, the logic level of the input signal Data is changed in period T3. At this point, when L level is inputted to the input signal Data, the node V1 is set at H level. When the input signal Data is at H level, the transistor MP12 is turned off and thus the node V1 holds L level.

In period T4, the control signal NVNB is set at H level, the transistor MP11 is turned off, and the transistor MN12 is turned on when the control signal NVPC is set at H level. Thus, a latch state is obtained and a logic level is held.

The level shift circuit captures the input signal Data of period T3 and outputs data captured in period T4 as the signals OUT1 and OUT2, so that the level shift circuit acts as a level shift circuit having a latch function.

Embodiment 7

Figure 11:
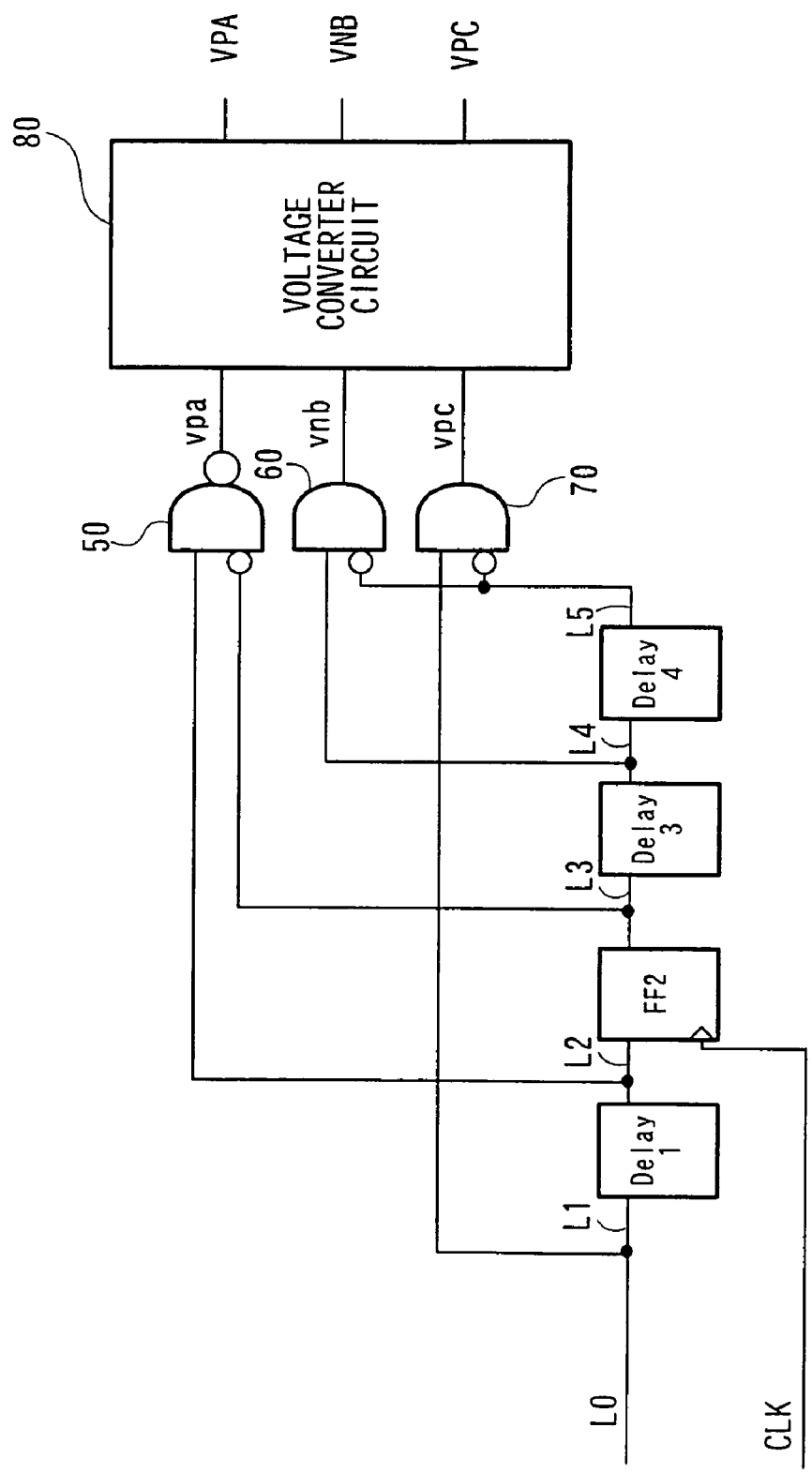
FIG. 11 is a structural diagram showing a control circuit of a level shift circuit according to (Embodiment 7) of the present invention.

FIG. 11 shows another example of the control circuit 20 in the level shift circuit of (Embodiment 1). Control signals VPA, VNB, and VPC are generated.

A level conversion signal L0 is inputted and delay devices Delay 1, Delay 3, and Delay 4 are used instead of the flip-flops FF1, FF3, and FF4 of FIG. 3. Other configurations are similar to those of FIG. 3.

According to this configuration, periods T0, T2, and T3 can be set according to the delay time values of the delay devices Delay 1, Delay 3, and Delay 4 regardless of a clock CLK.

Hence, it is possible to prevent an open or a short circuit on a node V1 of a level converter regardless of an output value of a flip-flop FF2, without the need for a clock at turn-on.

As with (Embodiment 7), some of the flip-flop circuits in the control circuit 20 may be replaced with delay devices in other embodiments.

Embodiment 8

Figure 12:
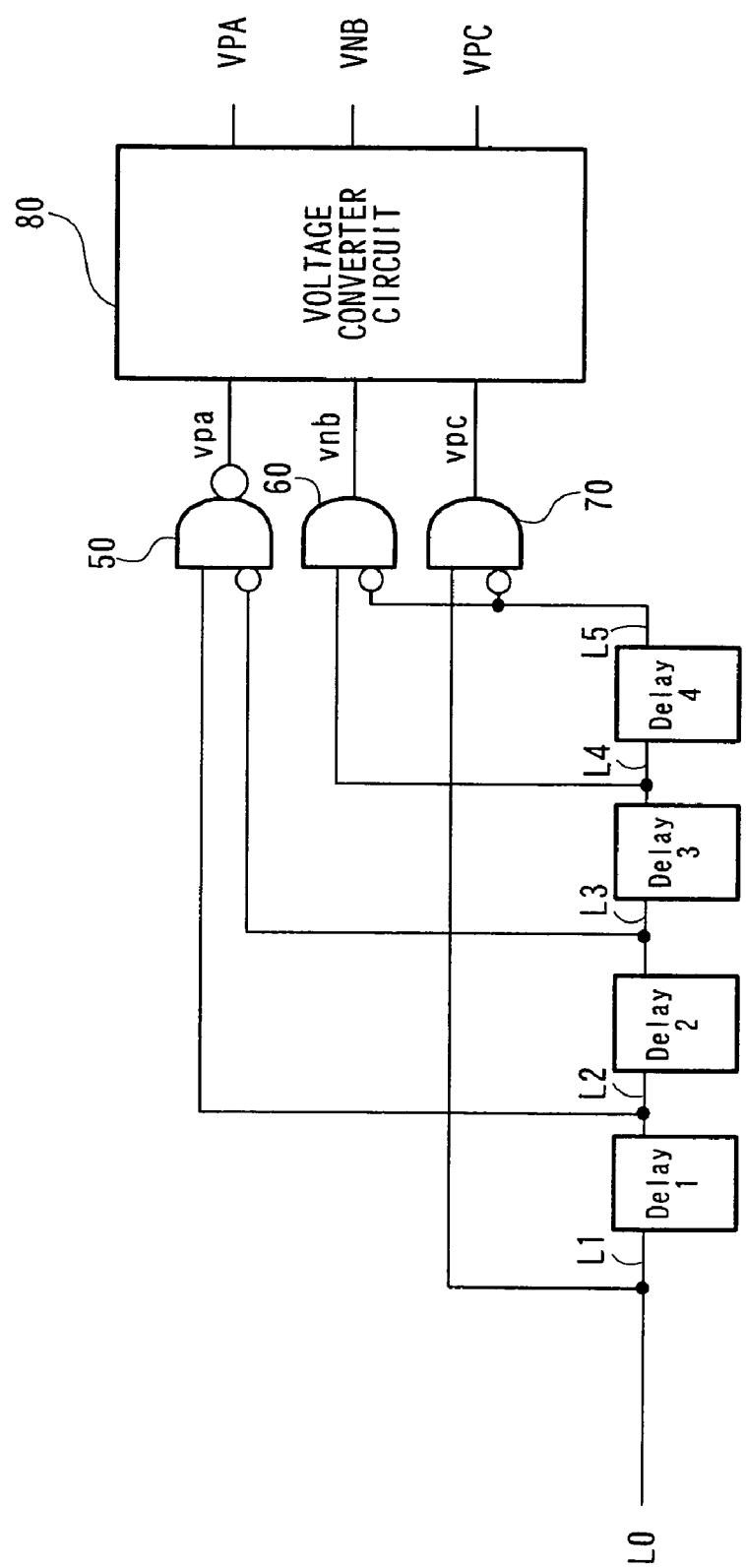
FIG. 12 is a structural diagram of a control circuit of a level shift circuit according to (Embodiment 8) of the present invention.

FIG. 12 shows another example of a control circuit 20 in a level shift circuit according to (Embodiment 1) of the present invention. Control signals VPA, VNB, and VPC are generated. The flip-flop FF2 of FIG. 11 is replaced with a delay device Delay 2, so that operations are not limited by clock timing.

To be specific, in FIGS. 3 and 4 of the foregoing embodiments, data conversion requires a four-clock period. Thus, when conversion is made in a period of less than four clocks, timing is provided by delay devices as (Embodiment 8). Further, since delay devices Delay 1 to Delay 4 are caused to have proper delay values, a precharge period, a data discharge period, and so on can be set at proper time periods.

As with (Embodiment 8), all of the flip-flop circuits in the control circuits 20 may be replaced with delay devices in other embodiments.

Embodiment 9

Figure 13:
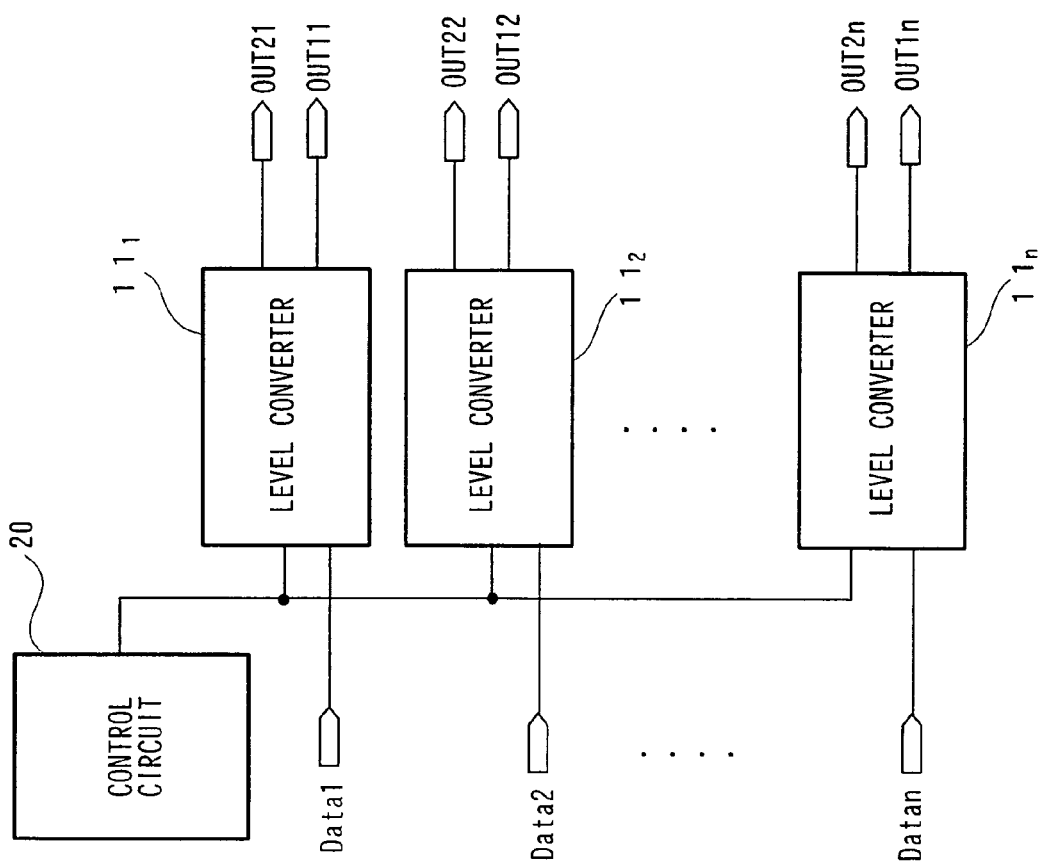
FIG. 13 is a structural diagram of a level shift circuit according to (Embodiment 9) of the present invention.

FIG. 13 shows a level shift circuit according to (Embodiment 9) of the present invention.

In this configuration, a control signal from a single control circuit 20 is supplied to two or more level converters 111, 112, . . . , and 11*n*.

For example, in the case of a liquid crystal driver using several thousands of level shift circuits where level conversion is simultaneously performed, an area can be reduced by controlling the two or more level shift circuits by means of the single control circuit.

Embodiment 10

Figure 14:
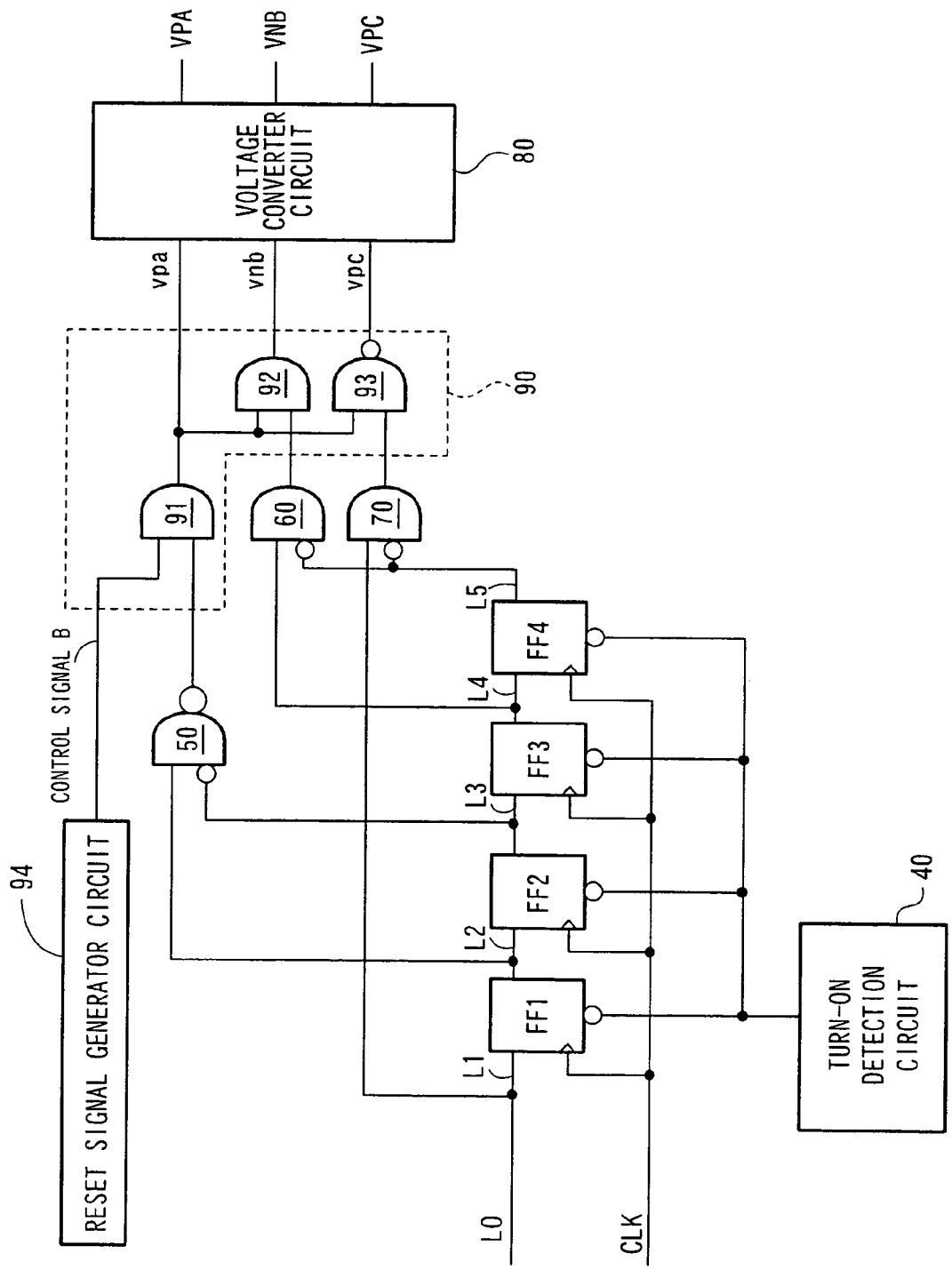
FIG. 14 is another structural diagram of a control circuit 20, which is a part of the level shift circuit of the present invention.

FIG. 14 shows a control circuit 20, which is a part of a level shift circuit according to (Embodiment 10) of the present invention. The control circuit 20 of FIG. 14 can be replaced with the control circuit 20 of the level shift circuit shown in FIG. 1.

In the level shift circuit shown in FIG. 1, a through current may pass through the level converter 10 depending upon the states of the control signals VPA, VNB, and VPC in the initial state at turn-on. In contrast, in the control circuit 20 shown in FIG. 14, an initialization circuit 90 is added between the input of a voltage converter circuit 80 and the outputs of logic circuits 50, 60, and 70 constituting logic cells. Moreover, a reset signal generator circuit 94 is added.

The initialization circuit 90 is composed of logic circuits 91, 92, and 93 constituting logic cells. The output signal of the logic circuit 50 and a control signal B, which serves as a voltage initialization control signal from the reset signal generator circuit 94, are supplied to the input of the logic circuit 91. The output signal of the logic circuit 91 is supplied to one input of each of the logic circuits 92 and 93, the output signal of the logic circuit 60 is supplied to the other input of the logic circuit 92, and the output signal of the logic circuit 70 is supplied to the other input of the logic circuit 93.

Figures 15A, 15B:
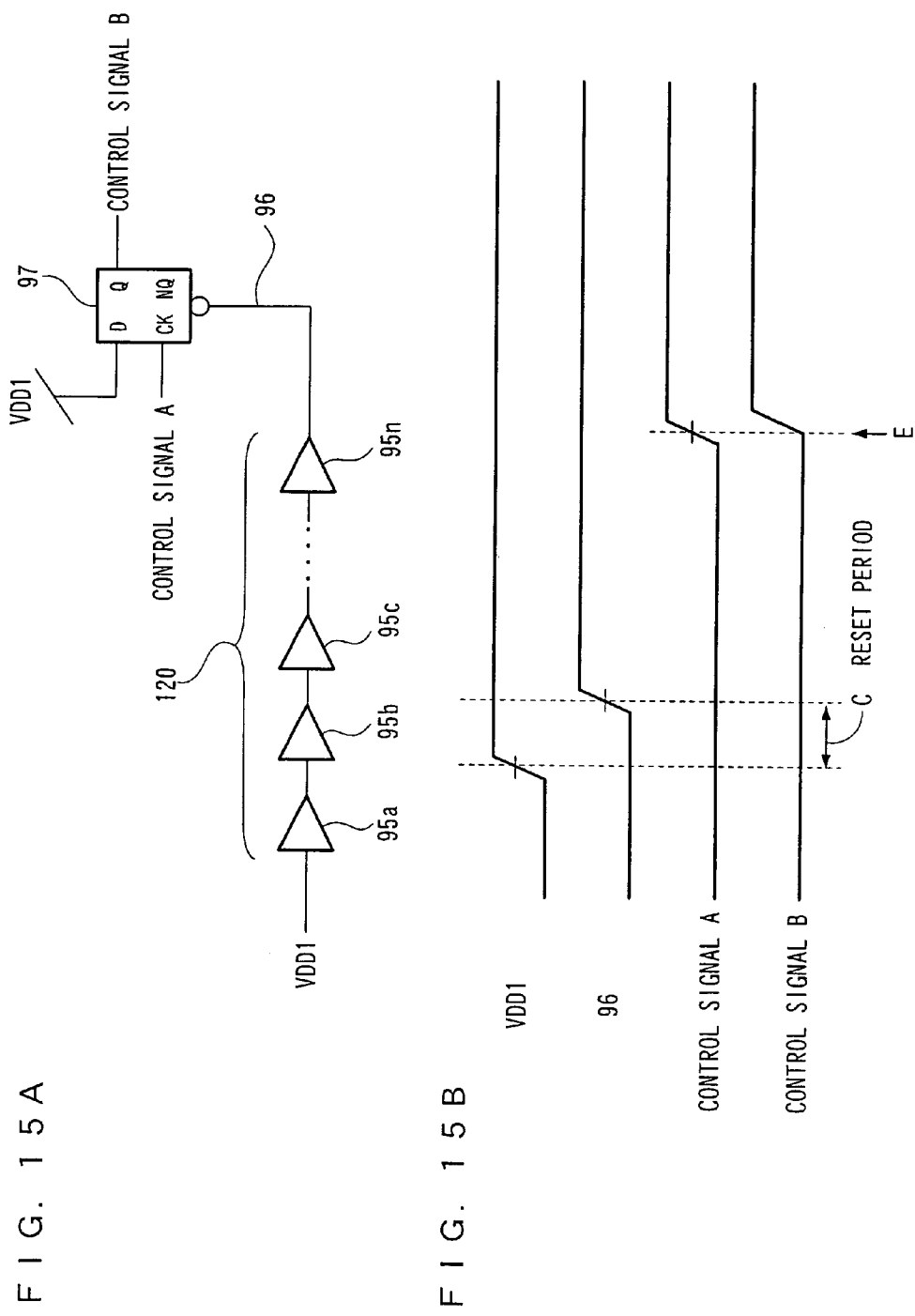
FIG. 15A is a structural diagram of a first circuit example of a reset signal generator circuit 94.
FIG. 15B is a timing chart of FIG. 15A.
Figure 16:
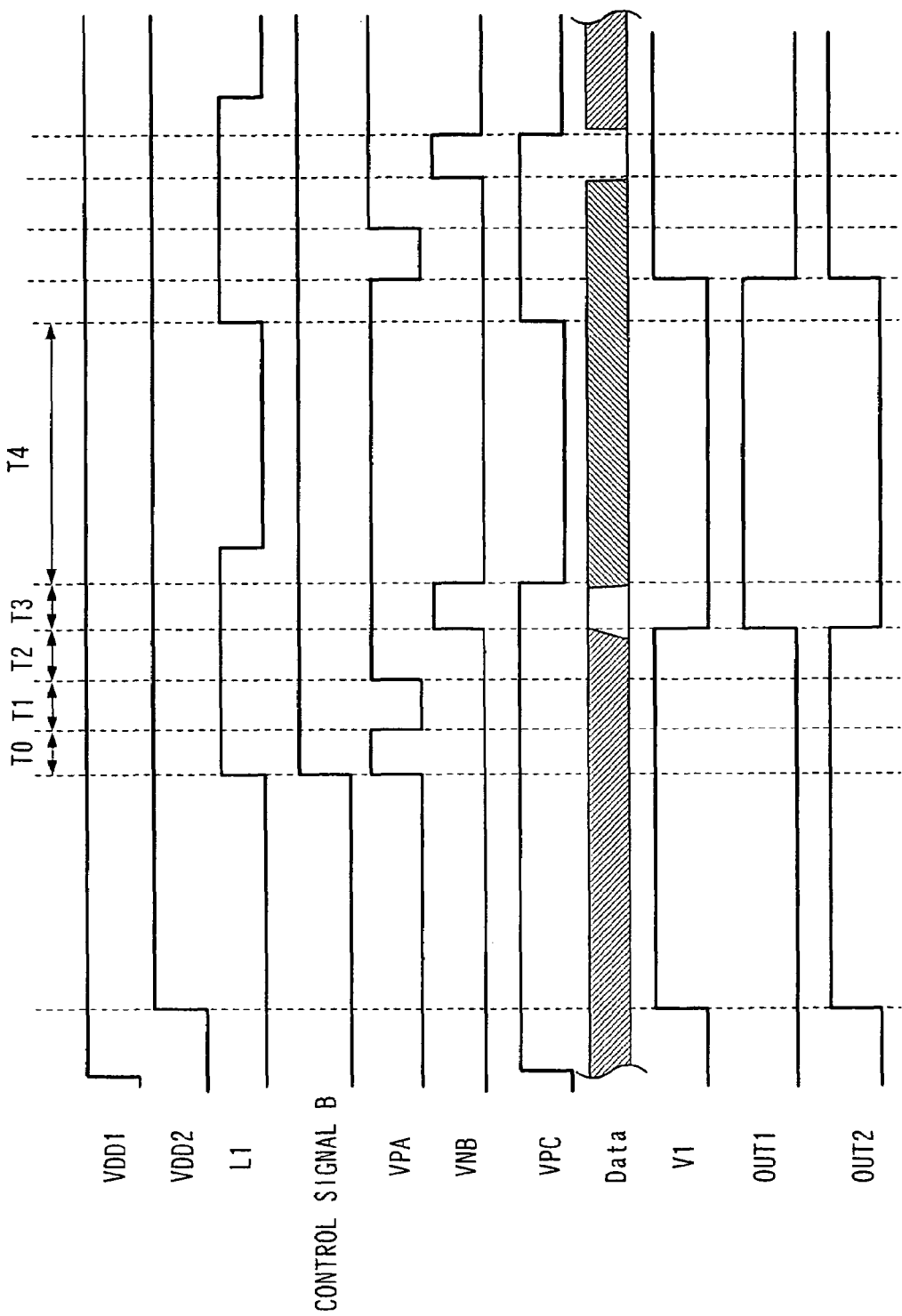
FIG. 16 is a timing chart of a level shift circuit using the control circuit 20 of FIG. 14.

A first circuit example of the reset signal generator circuit 94 for generating the control signal B is configured as FIG. 15A.

The reset signal generator circuit 94 is constituted of a delay unit 120, in which a plurality of buffers 95*a* to 95*n* are connected in series, and a D-type flip-flop 97. The gate of the buffer 95*a* in the first stage is connected to a power supply line for generating a first power supply voltage VDD1. The power-on signal 96 has a reset period obtained by delaying the rising edge of a power supply from the output of the buffer 95*n* in the last stage. A power-on signal 96 is obtained and used for resetting the flip-flop 97.

A data terminal D of the flip-flop 97 is connected to the power supply line for generating the first power supply voltage VDD1 and a control signal A is supplied to a clock terminal CK of the flip-flop 97. The control signal A changes in logic level after the power-on signal 96 which has delayed the first power supply voltage VDD1. The control signal B is generated from an output Q of the flip-flop 97. FIG. 15B shows a timing chart.

In this way, a period C from the rising edge of the first power supply voltage VDD1 to the generation of the power-on signal 96 is a reset period of the flip-flop 97. Even after the reset of the flip-flop 97 is canceled, the control signal B is kept at L level until the control signal A is generated. When the control signal A rises at timing E, the output Q of the flip-flop 97 rises for the first time. In other words, the level shift circuit, which comprises the control circuit 20 using the reset signal generator circuit 94 of FIG. 15A, operates according to the time chart of FIG. 16. From turn-on to the first rising edge of the control signal A, the control signal B is positively reset at L level and the control signals VPA, VNB, and VPC outputted from the control circuit 20 are reset in a stable manner.

In a liquid crystal driver or the like using the level shift circuit, this configuration makes it possible to expect stable level conversion regardless of the input order of the level shift conversion signal L0 and the clock CLK, which is inputted from a controller to the control circuit 20 at turn-on.

Any of second to ninth circuit examples shown in FIGS. 17 to 24 can enable the reset signal generator circuit 94 to reset and stabilize the control signals VPA, VNB, and VPC at turn-on.

The Second Circuit Example of the Reset Signal Generator Circuit 94

Figure 17:
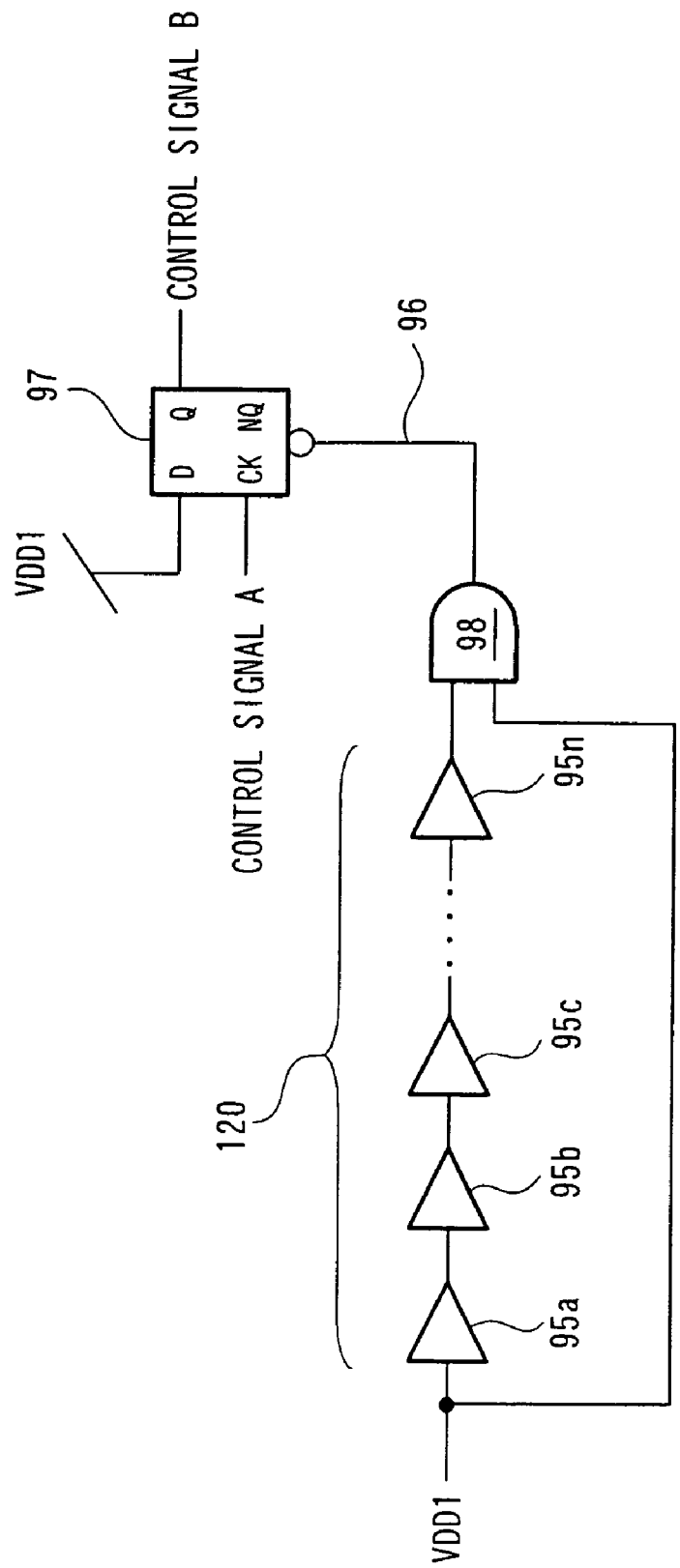
FIG. 17 is a structural diagram of a second circuit example of the reset signal generator circuit 94.

FIG. 17 shows the second circuit example. This example is different from FIG. 15A only in that an AND gate 98 is added. The output of a buffer 95*n* and a first power supply voltage VDD1 are supplied to the input of the AND gate 98. A flip-flop 97 is reset with the output of the AND gate 98 serving as a power-on signal 96.

The Third Circuit Example of the Reset Signal Generator Circuit 94

Figure 18A:
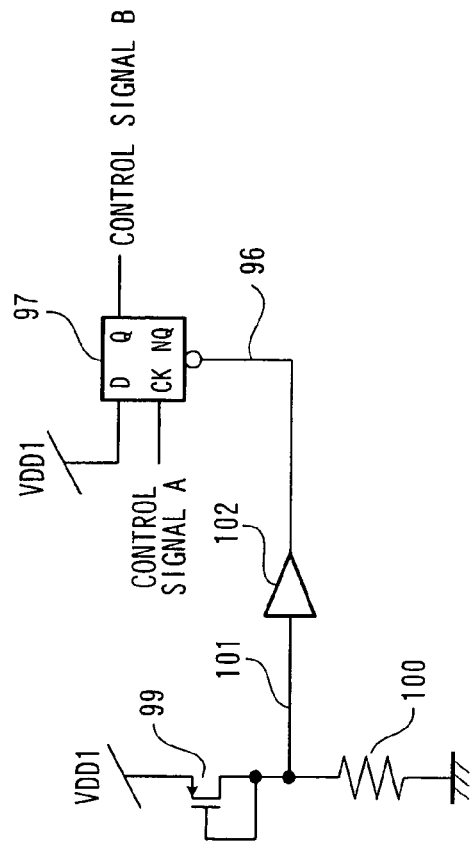
FIG. 18A is a structural diagram of a third circuit example of the reset signal generator circuit 94.
Figure 18B:
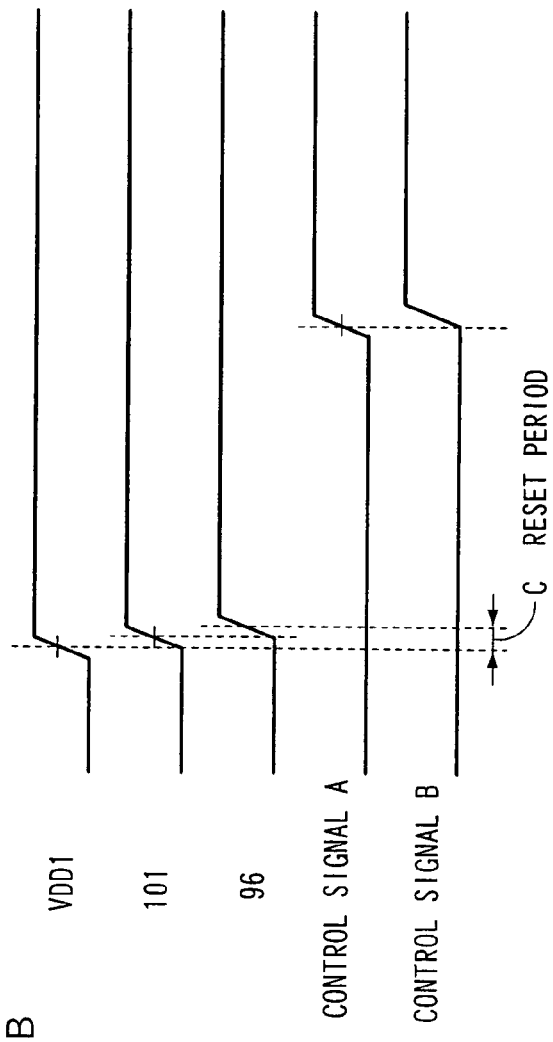
FIG. 18B is a timing chart of FIG. 18A.

FIG. 18A shows the third circuit example. In this example, a first power supply voltage VDD1 is applied to a series circuit of a resistor 100 and a Pch transistor 99 whose gate and drain are connected to each other, and a signal obtained from a node 101 of the Pch transistor 99 and the resistor 100 via a buffer 102 acts as a power-on signal 96 to reset a flip-flop 97. FIG. 18B shows a time chart. In this case, at the first rising edge of a control signal A after turn-on, a control signal B is changed from L level to H level.

Although the first power supply voltage VDD1 is applied to the series circuit of the Pch transistor 99 and the resistor 100, a power supply voltage corresponding to the first voltage may be applied in a similar manner.

The Fourth Circuit Example of the Reset Signal Generator Circuit 94

Figure 19A:
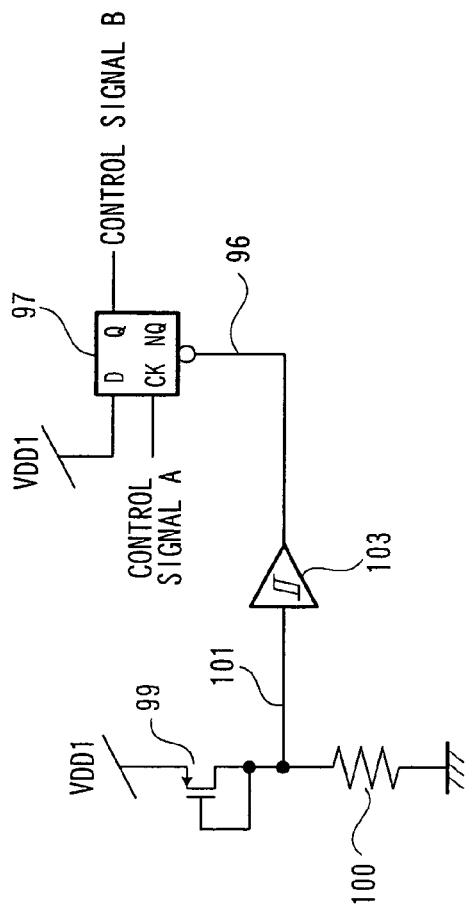
FIG. 19A is a structural diagram of a fourth circuit example of the reset signal generator circuit 94.
Figure 19B:
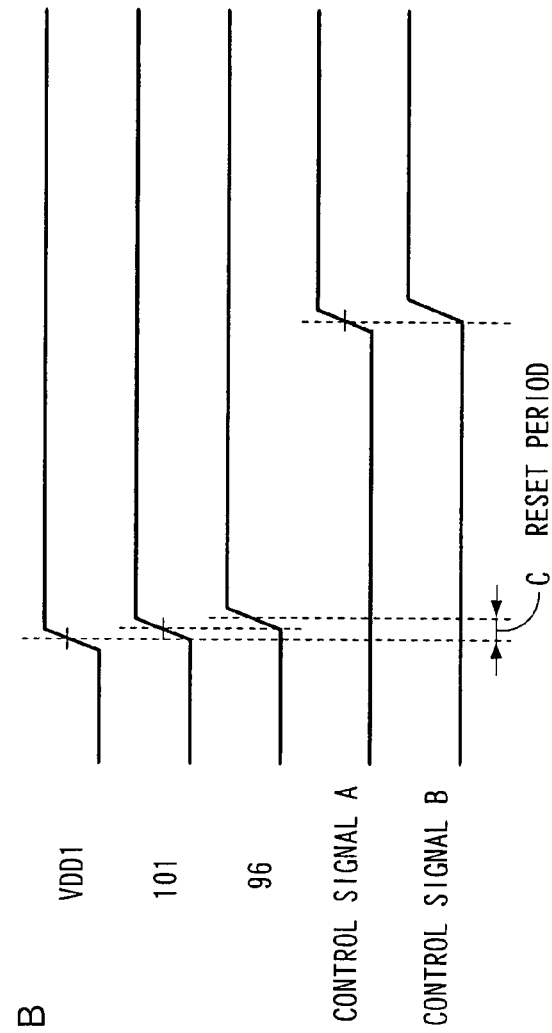
FIG. 19B is a timing chart of FIG. 19A.

FIG. 19A shows the fourth circuit example. This example is different only in that a buffer 103 having a hysteresis characteristic is used instead of the buffer 102 of the third circuit example. FIG. 19B shows a time chart. In this case, at the first rising edge of a control signal A after turn-on, a control signal B is changed from L level to H level.

The Fifth Circuit Example of the Reset Signal Generator Circuit 94

Figure 20A:
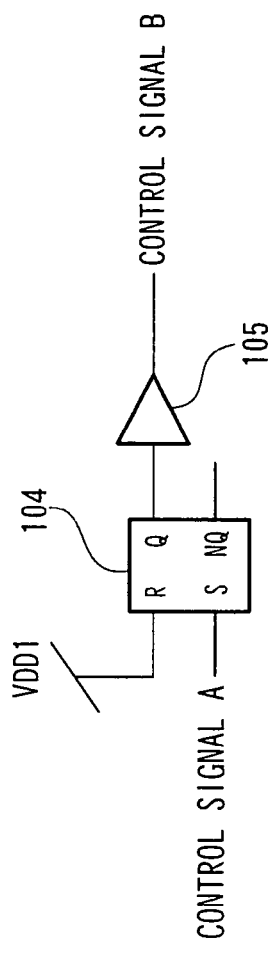
FIG. 20A is a structural diagram of a fifth circuit example of the reset signal generator circuit 94.
Figure 20B:
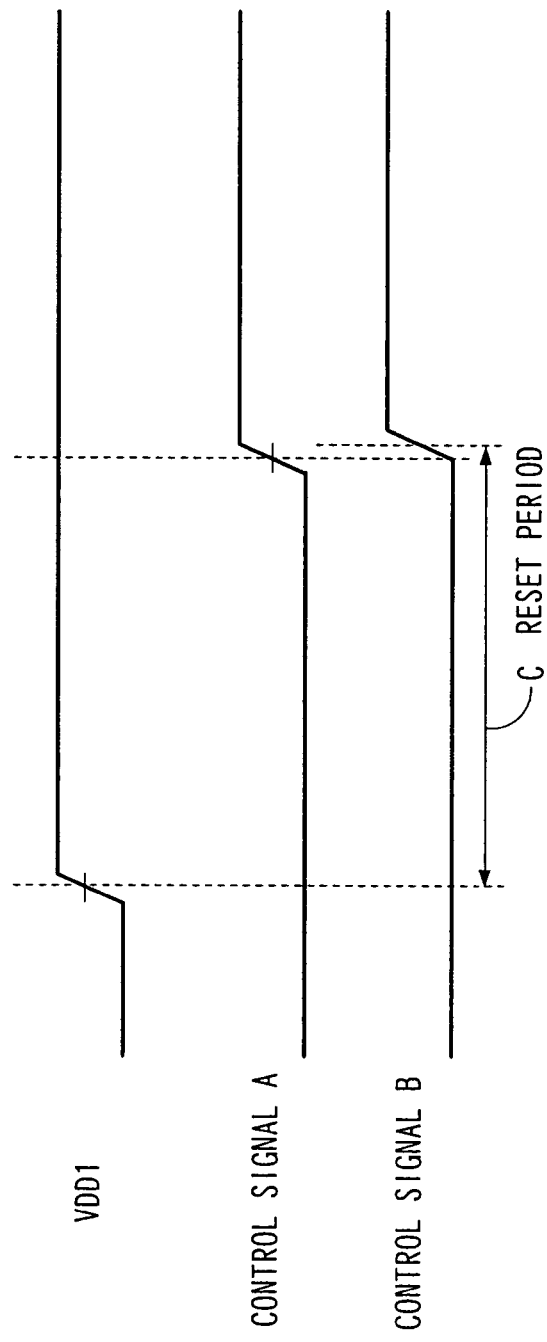
FIG. 20B is a timing chart of FIG. 20A.

FIG. 20A shows the fifth circuit example. The D flip-flop 97 is used in the first to fourth circuit examples, whereas an RS flip-flop 104 is used in the fifth circuit example. A reset input R of the flip-flop 104 is connected to a power supply line for generating a first power supply voltage VDD1, a control signal A is supplied to a set input S of the flip-flop 104, and a signal obtained from an output Q of the flip-flop 104 via a buffer 105 is used as a control signal B. FIG. 20B shows a time chart. In this case, at the first rising edge of the control signal A after turn-on, the control signal B is changed from L level to H level.

Although the control signal B is outputted from the output of the buffer 105, a signal from the output Q of the flip-flop 104 may act as the control signal B.

The Sixth Circuit Example of the Reset Signal Generator Circuit 94

Figure 21A:
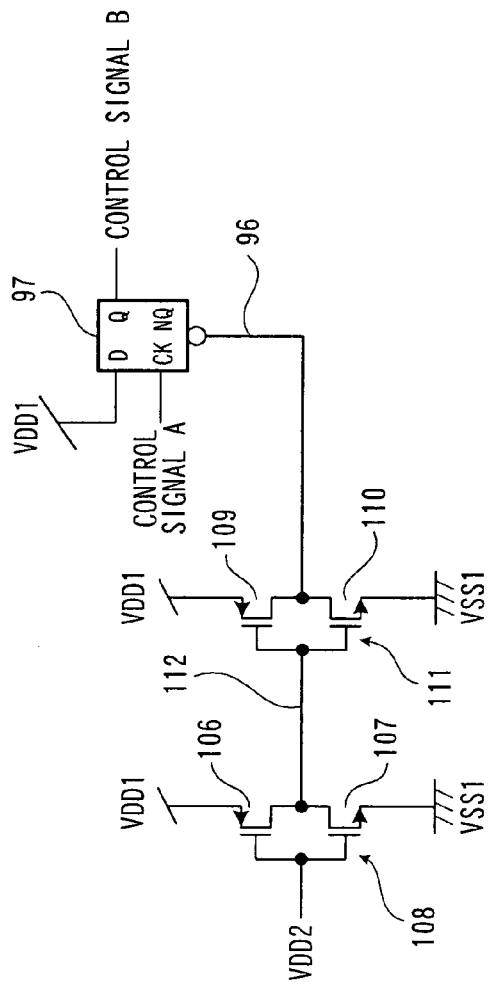
FIG. 21A is a structural diagram of a sixth circuit example of the reset signal generator circuit 94.

FIG. 21A shows the sixth circuit example. The foregoing first to fifth circuit examples are each constituted only of a low-voltage power supply using the first power supply voltage VDD1. The sixth to ninth circuit examples are each constituted of a combination of a low-voltage power supply and a medium breakdown voltage power supply using a second power supply voltage VDD2.

In FIG. 21A, the circuit is constituted of a first inverter 108 which is a series circuit of a Pch transistor 106 and an Nch transistor 107, a second inverter 111 which is a series circuit of a Pch transistor 109 and an Nch transistor 110, and a flip-flop 97.

The sources of the transistors 106 and 109 and a data input D of the flip-flop 97 are connected to a power supply line for generating a first power supply voltage VDD1. The sources of the transistors 107 and 110 are connected to a reference potential VSS1 of the first power supply voltage VDD1. The input of the first inverter 108 is connected to a power supply line for generating the second power supply voltage VDD2 and an output 112 of the first inverter 108 is connected to the input of the second inverter 111.

Figure 21B:
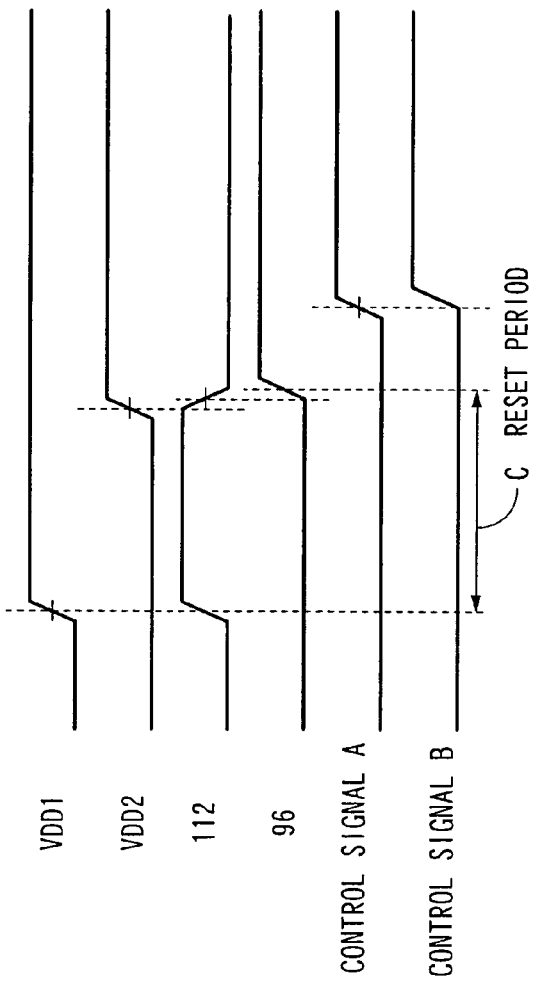
FIG. 21B is a timing chart of FIG. 21A.

The output signal of the second inverter 111 acts as a power-on signal 96 to reset the flip-flop 97. A control signal A is supplied to a clock terminal CK of the flip-flop 97, and the signal of an output Q of the flip-flop 97 is used as a control signal B. FIG. 21B shows a time chart. In this case, a period from the rising edge of the first power supply voltage VDD1 to the rising edge of the second power supply voltage VDD2 is a reset period C. The control signal B is changed from L level to H level at the first rising edge of the control signal A after turn-on.

Although the first power supply voltage VDD1 is applied to the first and second inverters 108 and 111, a power supply voltage corresponding to the first voltage may be applied in a similar manner.

The Seventh Circuit Example of the Reset Signal Generator Circuit 94

Figure 22A:
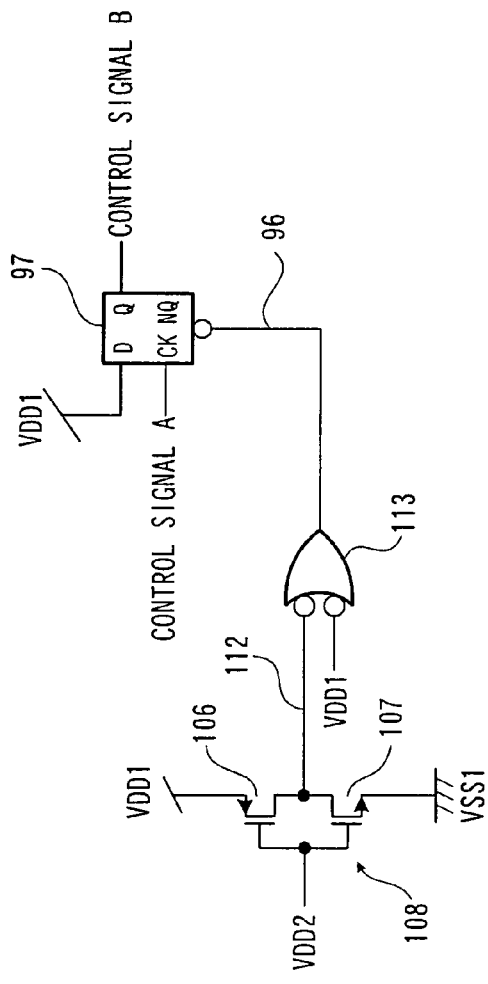
FIG. 22A is a structural diagram of a seventh circuit example of the reset signal generator circuit 94.

FIG. 22A shows the seventh circuit example. This example is different only in that a logic circuit 113 is used instead of the second inverter 111 of the sixth circuit example. One input of the logic circuit 113 for inverting a logical product is connected to a power supply line for generating a first power supply voltage VDD1. The other input of the logic circuit 113 is connected to the output 112 of the first inverter 108.

Figure 22B:
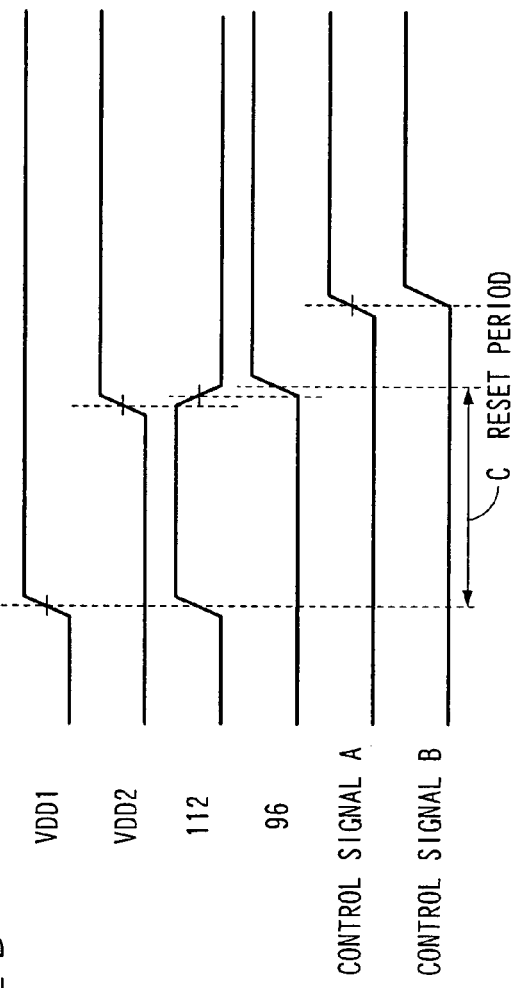
FIG. 22B is a timing chart of FIG. 22A.

The output signal of the logic circuit 113 acts as a power-on signal 96 to reset the flip-flop 97. FIG. 22B shows a time chart. In this case, a period from the rising edge of the first power supply voltage VDD1 to the rising edge of a second power supply voltage VDD2 is a reset period C. The control signal B is changed from L level to H level at the first rising edge of the control signal A after turn-on.

Although the first power supply voltage VDD1 is applied to the first inverter 108, a power supply voltage corresponding to the first voltage may be applied in a similar manner.

The Eighth Circuit Example of the Reset Signal Generator Circuit 94

Figure 23A:
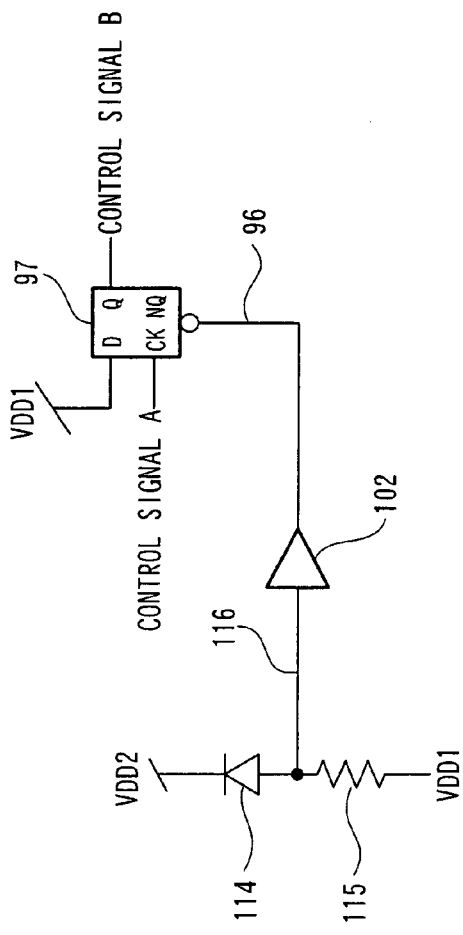
FIG. 23A is a structural diagram of an eighth circuit example of the reset signal generator circuit 94.
Figure 23B:
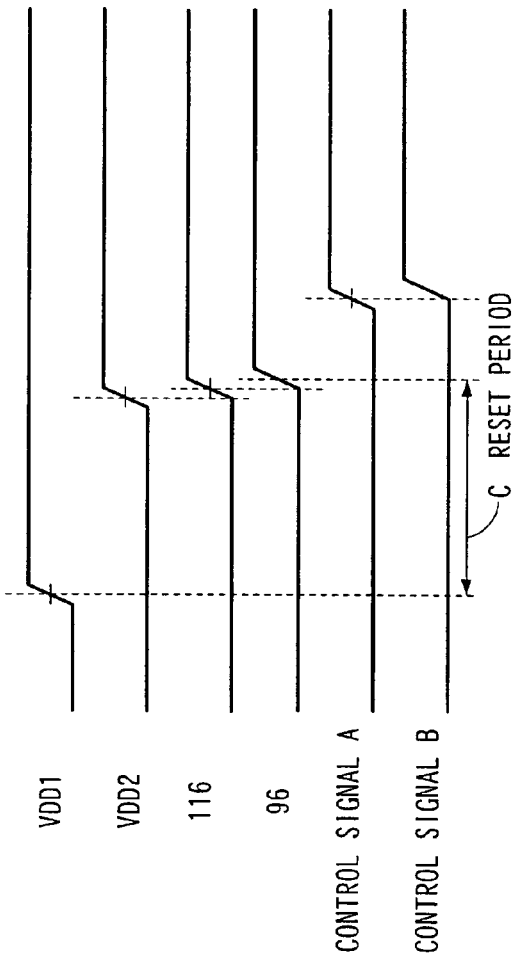
FIG. 23B is a timing chart of FIG. 23A.

FIG. 23A shows the eighth circuit example. In this example, a diode 114 and a resistor 115 are connected in series, the cathode of the diode 114 is connected to a power supply line for generating a second power supply voltage VDD2, the resistor 115 has one side which is opposite from a node connected to the anode of the diode 114 and is connected to a power supply line for generating a first power supply voltage VDD1, and a flip-flop 97 is reset by a power-on signal 96 obtained from a node 116 of the diode 114 and the resistor 115 via a buffer 102. A data input D of the flip-flop 97 is connected to the power supply line for generating the first power supply voltage VDD1 and a control signal A is supplied to a clock input CK of the flip-flop 97. A control signal B is obtained from an output Q of the flip-flop 97. FIG. 23B shows a time chart. In this case, a period from the rising edge of the first power supply voltage VDD1 to the rising edge of the second power supply voltage VDD2 is a reset period C. The control signal B is changed from L level to H level at the first rising edge of the control signal A after turn-on.

The Ninth Circuit Example of the Reset Signal Generator Circuit 94

Figure 24A:
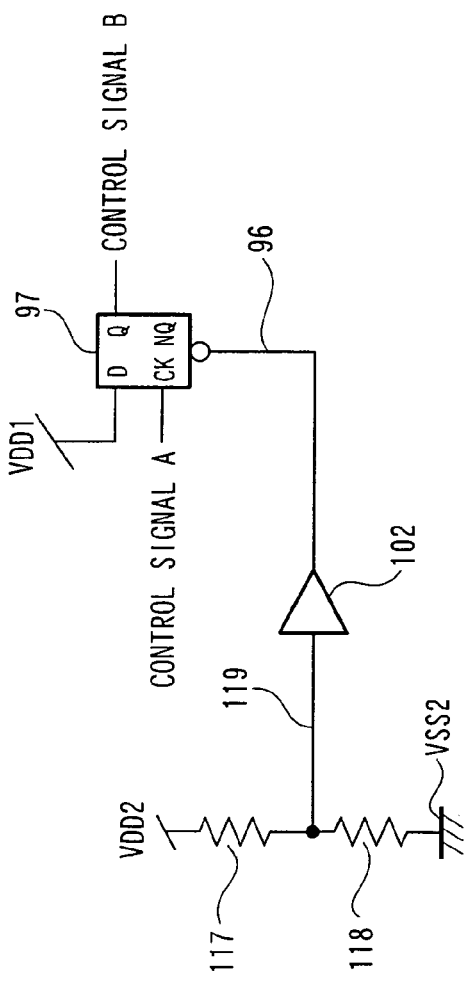
FIG. 24A is a structural diagram of a ninth circuit example of the reset signal generator circuit 94.
Figure 24B:
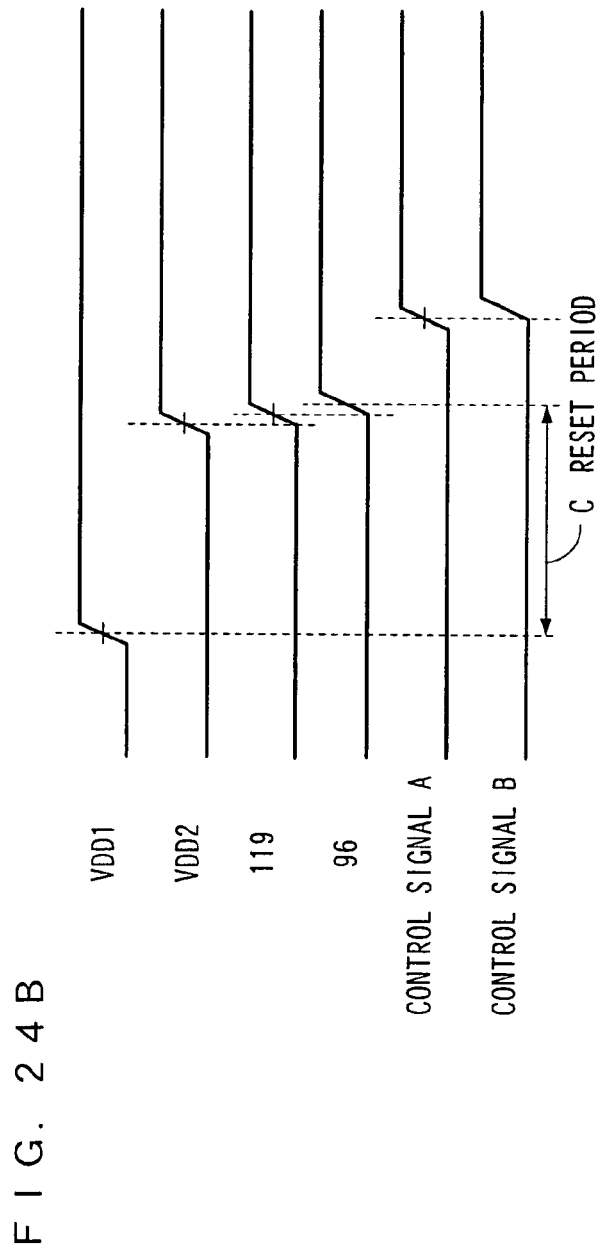
FIG. 24B is a timing chart of FIG. 24A.
Figure 25:
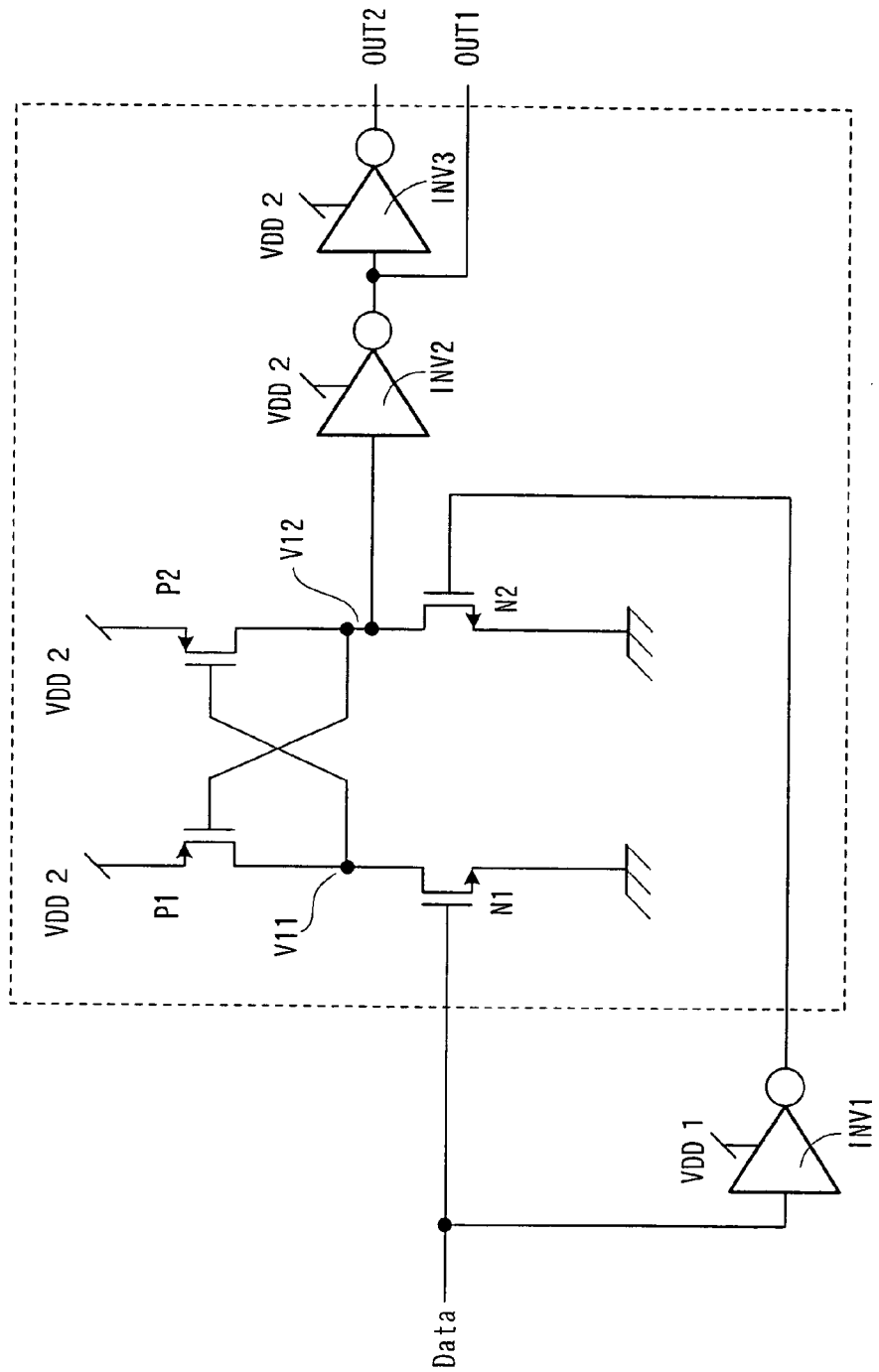
FIG. 25 is a structural diagram of a conventional level shift circuit.

FIG. 24A shows the ninth circuit example. In this example, the series circuit of the diode 114 and the resistor 115 of the eighth circuit example is replaced with a series circuit of resistors 117 and 118, one end of the series circuit of the resistors 117 and 118 is connected to a power supply line for generating a second power supply voltage VDD2, the other end of the series circuit of the resistors 117 and 118 is connected to a reference potential VSS2 of a second power supply voltage VDD2, and a flip-flop 97 is reset by a signal obtained as a power-on signal 96 from a node 119 of the resistors 117 and 118 via a buffer 102. A data input D of the flip-flop 97 is connected to a power supply line for generating a first power supply voltage VDD1 and a control signal A is supplied to a clock input CK of the flip-flop 97. A control signal B is obtained from an output Q of the flip-flop 97. FIG. 24B shows a time chart. In this case, a period from the rising edge of the first power supply voltage VDD1 to the rising edge of the second power supply voltage VDD2 is a reset period C. The control signal B is changed from L level to H level at the first rising edge of the control signal A after turn-on.

Although the second power supply voltage VDD2 is applied to the series circuit of the resistors 117 and 118, a power supply voltage corresponding to the second power supply voltage may be applied in a similar manner.

According to the level shift circuit of the present invention, it is possible to provide a level shift circuit having a latch function that achieves low power consumption and a small circuit area. The present invention is effective for a liquid crystal driver in a liquid crystal display apparatus or a level shift circuit of a liquid crystal display source driver.

What is claimed is:

1. A level shift circuit comprising:
   a plurality of level converters, and
   a single control circuit connected to the plurality of level converters, for supplying a set of control signals to each level converter simultaneously such that the set of control signals supplied to each of the plurality of level converters is the same, each one of the plurality of level converters comprising:
   a first P-channel transistor connected in series with a first N-channel transistor with a gate for receiving an input signal at a first voltage, and a second N-channel transistor, all between a second voltage source and ground;
   an input of a first inverter connected to a drain of the first P-channel transistor,
   an output of the first inverter connected to an input of a second inverter; and
   a capacitance connected to the input of the first inverter;
   wherein the single control circuit supplies said set of control signals to a gate of the first P-channel transistor and a gate of the second N-channel transistor, respectively, and
   one of the output of the first inverter or an output of the second inverter is for outputting signals at the second voltage.

2. A level shift circuit comprising:

a plurality of level converters, and a single control circuit connected to the plurality of level converters, for supplying a set of control signals to each level converter simultaneously, such that the same set of control signals is supplied to each of the plurality of level converters at the same time, each of the plurality of level converters comprising:

a first P-channel transistor connected in series with a second N-channel transistor, both between a voltage source at a second voltage level and ground;

an input of a first inverter connected to a drain of the first P-channel transistor and a drain of a second P-channel transistor;

an output of the first inverter connected to an input of a second inverter;

an output of the second inverter connected to a source of the second P-channel transistor; and an AND logic at a first voltage having an output for connecting to the gate of the second N-channel transistor, and a first input for receiving an input signal at the first voltage;

wherein the single control circuit supplies said set of control signals to a gate of the first P-channel transistor, a gate of the second P-channel transistor, and a second input of the AND logic, respectively; and the output of one of the first or second inverter is for outputting signals at the second voltage level.

3. A level shift circuit comprising:

a plurality of level converters, and a single control circuit connected to the plurality of level converters, for supplying a set of control signals to each level converter simultaneously, such that the same set of control signals is supplied to each of the plurality of level converters at the same time, each of the plurality of level converters comprising:

a first P-channel transistor connected in series with a second P-channel transistor, having a gate for receiving an input signal at a first voltage and a first ground level, and a first N-channel transistor, all between the first voltage and a second ground level, an input of a first inverter connected to a drain of the second P-channel transistor and a source of a second N-channel transistor, an output of the first inverter connected to an input of a second inverter, an output of the second inverter connected to a drain of the second N-channel transistor, and means for supplying said set of control signals from the single control circuit to a gate of the first P-channel transistor, a gate of the first N-channel transistor, and a gate of the second N-channel transistor, the output of one of the first or second inverter for outputting a signal at the second ground level.

4. A level shift circuit comprising:

a level converter, and a control circuit connected to the level converter, the level converter comprising:

a first P-channel transistor connected in series with a second N-channel transistor, all between a second voltage source and ground, an input of a first inverter connected to a drain of the first P-channel transistor and a drain of a second P-channel transistor, an output of the first inverter connected to an in put of a second inverter, an output of the second inverter connected to a source of the second P-channel transistor, and an AND logic at a first voltage level having an output for connecting to the gate of the second N-channel transistor and a first input for receiving an input signal at the first voltage, wherein the single control circuit supplies said set of control signals to a gate of the first P-channel transistor, a gate of the second P-channel transistor, and a second input of the AND logic, respectively, and the output of one of the first or second inverters outputs signals at the second voltage level.

5. A level shift circuit comprising:

a plurality of level converters, and a single control circuit connected to the plurality of level converters, for supplying a set of control signals to each level converter simultaneously, such that the same set of control signals is supplied to each of the plurality of level converters at the same time, each of the pluraliy of level converters comprising:

a first P-channel transistor connected in series with a first N-channel transistor having a gate for receiving an input signal at a first voltage, and a second N-channel transistor, all between a second voltage source and ground, an input of a first inverter connected to a drain of the first P-channel transistor and one of: (1) a drain of a second P-channel transistor, (2) a source of a third N-channel transistor, or (3) a drain of a third P-channel transistor connected to a drain of a fourth N-channel transistor, an output of the first inverter connected to an input of a second inverter, and an output of the second inverter connected to one of: (1') a source of the second P-channel transistor, (2') a drain of the third N-channel transistor, or (3') a source of the third P-channel transistor connected to a source of the fourth N-channel transistor, wherein the single control circuit supplies said set of control signals to a gate of the first P-channel transistor, a gate of the second N-channel transistor, and one of: (1") a gate of the second P-channel transistor, (2") a gate of the third N-channel transistor, or (3") a gate of the third P-channel transistor and a gate of the fourth N-channel transistor, respectively, and the output of one of the first or second inverters outputs signals at the second voltage level.

6. The level shift circuit according to claim 5, wherein the control circuit comprises:

two or more stages of flip-flop circuits operating at the first voltage, logic cells for receiving outputs from the two or more stages of the flip-flop circuits and outputting the control signals, and a voltage converter circuit for converting the control signals having been outputted from the logic cells into the control signals at the second voltage level.

7. The level shift circuit according to claim 6, wherein the control circuit further comprises a turn-on detection circuit for resetting or setting the two or more stages of flip-flop circuits at turn-on.

8. The level shift circuit according to claim 6, wherein at least some of the two or more stages of flip-flop circuits are delay devices.

9. The level shift circuit according to claim 6, wherein the control circuit further comprises an initialization circuit for outputting the control signals having been outputted from the logic cells, as control signals initialized according to a voltage initialization control signal, wherein the voltage converter circuit converts the control signals generated at an output of the initialization circuit into the control signals operating at the second voltage.

10. The level shift circuit according to claim 9, further comprising a reset signal generator circuit for generating the voltage initialization control signal set after detection of a rising edge of the first voltage, wherein the initialization circuit outputs the initialized control signals according to the voltage initialization control signal having been generated at an output of the reset signal generator circuit.

11. The level shift circuit according to claim 10, wherein the reset signal generator circuit comprises:
a delay unit constituted of buffers for delaying the rising edge of the first voltage and outputting the first voltage, and
a flip-flop which has the first voltage sam input, a reset fed with an output of the delay unit, and a clock U with a control signal rising after the rising edge of the first voltage, wherein
the voltage initialization control signal is outputted from an output of the flip-flop.

12. The level shift circuit according to claim 10, wherein the reset signal generator circuit comprises:
a delay unit constituted of buffers for delaying the rising edge of the first voltage and outputting the first voltage,
a logic element for determining a logical product of the first voltage and an output of the delay unit, and
a flip-flop which has the first voltage can input, a reset U with an output of the logic element, and a clock U with a control signal rising after the rising edge of the first voltage, wherein
the voltage initialization coal signal is outputted from an output of the flip-flop.

13. The level shift circuit according to claim 10, wherein the reset signal generator circuit comprises:
a series circuit having a series connection of a resistor and a P-channel transistor whose gate and drain are connected to each other, the series circuit being fed with the first power supply or a power supply corresponding to the first power supply,
a buffer having an input connected to a node of the P-channel transistor and the resistor, and
a flip-flop which has the first voltage as an input, a reset fed with an output of the buffer, and a clock fed with a control signal rising after the rising edge of the first voltage, wherein
the voltage initialization control signal is outputted from an output of the flip-flop.

14. The level shift circuit according to claim 10, wherein the reset signal generator circuit comprises:
a series circuit having a series connection of a resistor and a P-channel transistor whose gate and drain are connected to each other, the series circuit being fed with the first power supply or a power supply corresponding to the first power supply,
a buffer which exhibits hysteresis and has an input connected to a node of the P-channel transistor and the resistor, and
a flip-flop which has the first voltage as an input, a reset fed with an output of the buffer, and a clock fed with a control signal rising after the rising edge of the first voltage, wherein
the voltage initialization control signal is outputted from an output of the flip-flop.

15. The level shift circuit according to claim 10, wherein the reset signal generator circuit comprises an RS flip-flop having a reset fed with the first voltage and a set fed with a control signal rising after the rising edge of the first voltage, wherein the voltage initialization control signal is outputted from an output of the RS flip-flop.

16. The level shift circuit according to claim 9, further comprising a reset signal generator circuit for generating the voltage initialization control signal set after detection of a rising edge of the first voltage and the second voltage, wherein the initialization circuit outputs the initialized control signals according to the voltage initialization control signal having been generated at an output of the reset signal generator circuit.

17. The level shift circuit according to claim 16, wherein the reset signal generator circuit comprises:
a first inverter which has the second voltage as an input and is provided between a ground and the first voltage or a power supply corresponding to the first voltage,
a second inverter which has an output of the first inverter as an input and is provided between the ground and the first voltage or a power supply corresponding to the first voltage, and
a flip-flop which has the first voltage as an input, a reset fed with an output of the second inverter, and a clock fed with a control signal rising after the rising edge of the first voltage, wherein
the voltage initialization control signal is outputted from an output of the flip-flop.

18. The level shift circuit according to claim 16, wherein the reset signal generator circuit comprises:
an inverter which has the second voltage as an input and is provided between a ground and the first voltage or a power supply corresponding to the first voltage,
a logic element for inverting a logical product of the first voltage and an output of the inverter, and
a flip-flop which has the first voltage as an input, a reset fed with an output of the logic element, and a clock fed with a control signal rising after the rising edge of the first voltage, wherein
the voltage initialization control signal is outputted from an output of the flip-flop.

19. The level shift circuit according to claim 16, wherein the reset signal generator circuit comprises:
a series circuit of a diode and a resistor between the second voltage and the first voltage,
a buffer having an input connected to a signal outputted from a node of the diode and the resistor, and
a flip-flop which has the first voltage as an input, a reset fed with an output of the buffer, and a clock fed with a control signal rising after the rising edge of the first voltage, wherein
the voltage initialization control signal is outputted from an output of the flip-flop.

20. The level shift circuit according to claim 16, wherein the reset signal generator circuit comprises:
a series circuit of first and second resistors between a ground and the second voltage or a power supply corresponding to the second voltage,
a buffer having an input connected to a signal outputted from a node of the first resistor and the second resistor, and
a flip-flop which has the first voltage as an input, a reset fed with an output of the buffer, and a clock fed with a control signal rising after the rising edge of the first voltage, wherein
the voltage initialization control signal is outputted from an output of the flip-flop.

21. The level shift circuit according to claim 5, wherein a node for connecting the drain of the first P-channel transistor and a drain of the first N-channel transistor has a longer wire length than a node for connecting a source of the first N-channel transistor and a drain of the second N-channel transistor.

22. A liquid crystal display driver, comprising the level shift circuit of claim 5.

23. A liquid crystal display source driver, comprising the level shift circuit of claim 5.

* * * * *